US009869566B2

(12) United States Patent
Tima et al.

(10) Patent No.: US 9,869,566 B2
(45) Date of Patent: Jan. 16, 2018

(54) ANGLE SENSING USING DIFFERENTIAL MAGNETIC MEASUREMENT AND A BACK BIAS MAGNET

(71) Applicant: Allegro Microsystems, LLC, Worcester, MA (US)

(72) Inventors: Simon Tima, Annecy (FR); Yannick Vuillermet, Voglans (FR); Andreas P. Friedrich, Metz-Tessy (FR); Thomas Kerdraon, Lenzkirch (DE)

(73) Assignee: Allegro MicroSystems, LLC, Worcester, MA (US)

( * ) Notice: Subject to any disclaimer, the term of this patent is extended or adjusted under 35 U.S.C. 154(b) by 164 days.

(21) Appl. No.: 15/042,469

(22) Filed: Feb. 12, 2016

(65) Prior Publication Data

US 2017/0234702 A1    Aug. 17, 2017

(51) Int. Cl.
*G01B 7/30* (2006.01)
*G01D 5/20* (2006.01)
(Continued)

(52) U.S. Cl.
CPC ............. *G01D 5/2013* (2013.01); *G01B 7/14* (2013.01); *G01R 33/072* (2013.01)

(58) Field of Classification Search
CPC ............ G01D 5/02; G01D 5/04; G01D 5/145; G01D 5/147; G01D 5/2457; G01D 5/2013; G01D 5/2046; G01B 7/14; G01B 7/30; G01B 7/146; G01R 33/30; G01R 33/07; G01R 33/077; G01R 33/0082;
(Continued)

(56) References Cited

U.S. PATENT DOCUMENTS 5,841,621 A    11/1998 Dean et al.
6,181,036 B1    1/2001 Kazama et al.
(Continued)

FOREIGN PATENT DOCUMENTS

DE    10 2006 037 226 A1    2/2008
WO    WO2015/013705    1/2015

OTHER PUBLICATIONS

Notice of Allowance dated Jan. 13, 2017 corresponding to U.S. Appl. No. 14/570,357; 11 Pages.
(Continued)

*Primary Examiner* — Thang Le
(74) *Attorney, Agent, or Firm* — Daly, Crowley, Mofford & Durkee, LLP

(57) ABSTRACT

A magnetic field sensor includes a back bias magnet to generate a DC magnetic field. First and second magnetic field sensing elements of the magnetic field sensor are disposed proximate to at least one ferromagnetic surface of a ferromagnetic target object. The first and second magnetic field sensing elements generate first and second electronic signals, respectively, in response to first and second sensed magnetic fields corresponding to the DC magnetic field but influenced by the at least one ferromagnetic surface. The magnetic field sensor generates a difference signal that is a difference of amplitudes of the first and second electronic signals. The difference signal is indicative of a rotation measurement of an absolute relative rotation of the ferromagnetic target object and the magnetic field sensor about a rotation axis.

26 Claims, 19 Drawing Sheets

(51) Int. Cl.
*G01R 33/07* (2006.01)
*G01B 7/14* (2006.01)

(58) Field of Classification Search
CPC ........... G01R 33/09; G01P 1/026; G01P 3/66;
G01P 3/68; G01P 3/665; G01P 3/443;
G01P 3/488; G01P 3/487; G01P 3/481;
G01P 3/685
USPC ................ 324/173–174, 178–179, 161, 162,
324/207.2–207.25, 259
See application file for complete search history.

(56) References Cited

U.S. PATENT DOCUMENTS

| | | | |
|---|---|---|---|
| 6,288,533 B1* | 9/2001 | Haeberli | A61K 48/00 324/207.12 |
| 6,459,261 B1 | 10/2002 | Luetzow et al. | |
| 7,088,095 B1 | 8/2006 | Busch | |
| 9,417,295 B2* | 8/2016 | Friedrich | G01R 33/0023 |
| 9,605,975 B2* | 3/2017 | Foletto | G01D 5/142 |
| 2004/0239313 A1 | 12/2004 | Godkin | |
| 2008/0174301 A1 | 7/2008 | Mattson | |
| 2008/0184799 A1 | 8/2008 | Phan Le et al. | |
| 2009/0001965 A1 | 1/2009 | Ausserlechner et al. | |
| 2009/0102463 A1* | 4/2009 | May | G01D 5/2013 324/207.16 |
| 2009/0146647 A1 | 6/2009 | Ausserlechner | |
| 2010/0188074 A1 | 7/2010 | Matsumoto et al. | |
| 2011/0227568 A1 | 9/2011 | Dordet et al. | |
| 2012/0158335 A1 | 6/2012 | Donovan et al. | |
| 2012/0262155 A1 | 10/2012 | Donovan et al. | |
| 2013/0320970 A1* | 12/2013 | Foletto | G01D 5/2448 324/251 |
| 2015/0022187 A1 | 1/2015 | Taylor et al. | |
| 2015/0022188 A1 | 1/2015 | Daubert et al. | |
| 2015/0176962 A1 | 6/2015 | Kerdraon et al. | |
| 2015/0377648 A1 | 12/2015 | Sirohiwala et al. | |

OTHER PUBLICATIONS

Preliminary Amendment filed on Feb. 24, 2015; for U.S. Appl. No. 14/570,357; 12 pages.
Office Action dated Sep. 15, 2016, for U.S. Appl. No. 14/570,357; 17 pages.
Response filed on Dec. 9, 2016 to Office Action dated Sep. 15, 2016; for U.S. Appl. No. 14/570,357; 26 pages.
PCT Search Report and Written Opinion of ISA for PCT/US2014/070339 dated Mar. 25, 2015; 16 pages.
Letter from A.A. Thornton letter dated Feb. 13, 2017 regarding amended claims for EP Pat. Appl. No. 14827615.7; 4 pages.
Amended Claims pages 36 to 45 regarding A.A. Thornton letter dated Feb. 13, 2017 for EP Pat. Appl. No. 14827615.7; 10 pages.
PCT International Search Report and Written Opinion dated May 18, 2017 for International PCT Application No. PCT/US/2017/014505; 14 pages.
PCT International Search Report and Written Opinion dated May 18, 2017 for PCT International Appl. No. PCT/US2017/014505; 14 pages.
PCT International Preliminary Report and Patentability and Written Opinion dated Jul. 7, 2016; for PCT Pat. App. No. PCT/US2014/070339; 14 pages.
PCT Communication relating to the results of the partial international search for PCT/US2017/020067 dated Jun. 7, 2017; 11 pages.
U.S. Appl. No. 15/074,358, filed Mar. 18, 2016, Kranz, et al.
Non-final Office Action dated Sep. 25, 2017 for U.S. Appl. No. 15/074,358; 9 pages.
EP Communication under Rule 71(3) EPC Intention to Grant dated Aug. 10, 2017 for EP Application No. 14827615.7; 7 pages.
EP Allowed Specification dated Jul. 2, 2015 for EP Application No, 14827615.7; 55 pages.

* cited by examiner

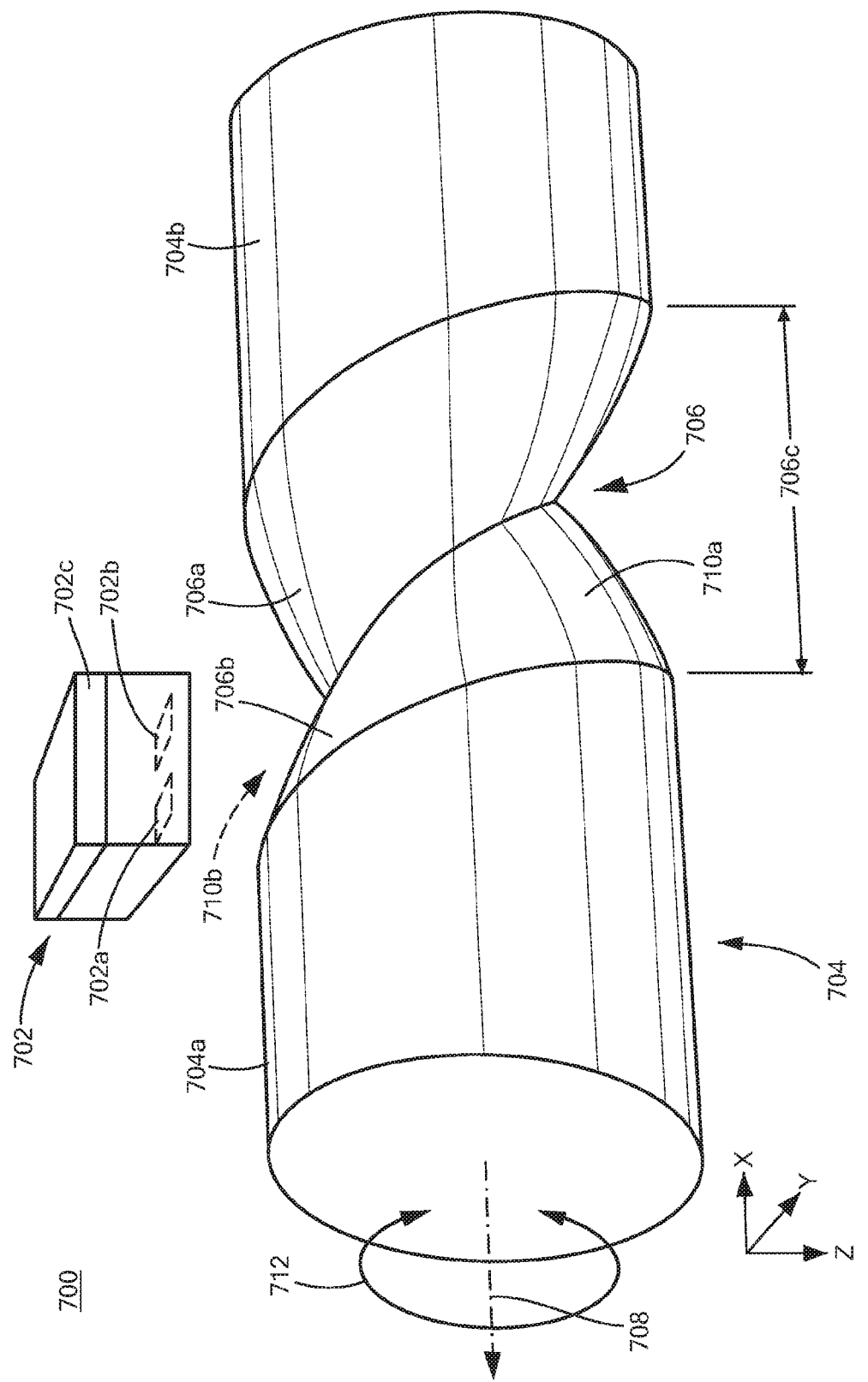

ANGLE SENSING USING DIFFERENTIAL MAGNETIC MEASUREMENT AND A BACK BIAS MAGNET

CROSS-REFERENCE TO RELATED APPLICATIONS

None.

STATEMENT REGARDING FEDERALLY SPONSORED RESEARCH OR DEVELOPMENT

None.

BACKGROUND

Magnetic field sensors generally include a magnetic field sensing element and other electronic components. Magnetic field sensors provide an electrical signal representative of a magnetic field sensed by the magnetic field sensing element. Various types of magnetic field sensing elements are known, including Hall Effect elements and magnetoresistance elements.

Magnetic field sensors provide information about a sensed ferromagnetic object by sensing fluctuations of the sensed magnetic field. Some magnetic field sensors include a fixed permanent magnet in a so-called "back bias" arrangement. Such magnetic field sensors sense fluctuations of the magnetic field associated with the permanent magnet as an object moves within a magnetic field generated by the magnet. In the presence of a moving ferromagnetic object, the magnetic field sensed by the magnetic field sensor varies in accordance with a shape or profile of the moving ferromagnetic object (a "target object").

In automotive applications, a typical magnetic field sensor might determine a rotation of a target object, for example, a camshaft in an engine, and provide information about the rotation of the target object (e.g., an angle of rotation, etc.) to an engine control processor.

However, some current solutions can require complex processing by the magnetic field sensor to be able to determine the information about the rotation of the target object (e.g., an absolute angle of rotation, speed of rotation, direction of rotation, etc.). Such complex processing can require more expensive components and additional development expense. Some current solutions employ multiple magnetic field sensing elements or complexly shaped target objects, which also can increase complexity and cost. It would be desirable to provide a magnetic field sensor that can generate an output signal representative of an absolute relative rotational angle of the magnetic field sensor and a proximate target object. Therefore, an improved magnetic field sensor and target object arrangement is needed.

SUMMARY

This Summary is provided to introduce a selection of concepts in a simplified form that are further described below in the Detailed Description. This Summary is not intended to identify key or essential features or combinations of the claimed subject matter, nor is it intended to be used to limit the scope of the claimed subject matter.

One aspect provides a magnetic field sensor that includes a back bias magnet to generate a DC magnetic field. First and second magnetic field sensing elements of the magnetic field sensor are disposed proximate to at least one ferromagnetic surface of a ferromagnetic target object. The first and second magnetic field sensing elements generate first and second electronic signals, respectively, in response to first and second sensed magnetic fields corresponding to the DC magnetic field but influenced by the at least one ferromagnetic surface. The magnetic field sensor generates a difference signal that is a difference of amplitudes of the first and second electronic signals. The difference signal is indicative of a rotation measurement of an absolute relative rotation of the ferromagnetic target object and the magnetic field sensor about a rotation axis.

BRIEF DESCRIPTION OF THE DRAWING FIGURES

Other aspects, features, and advantages of the described embodiments will become more fully apparent from the following detailed description, the appended claims, and the accompanying drawings in which like reference numerals identify similar or identical elements. Reference numerals that are introduced in the specification in association with a drawing figure might be repeated in one or more subsequent figures without additional description in the specification in order to provide context for other features.

FIG. 7A is a diagram showing another illustrative system having a magnetic field sensor with two magnetic field sensing elements proximate to a target object with a another different helical groove;

DETAILED DESCRIPTION

Figure 1A:
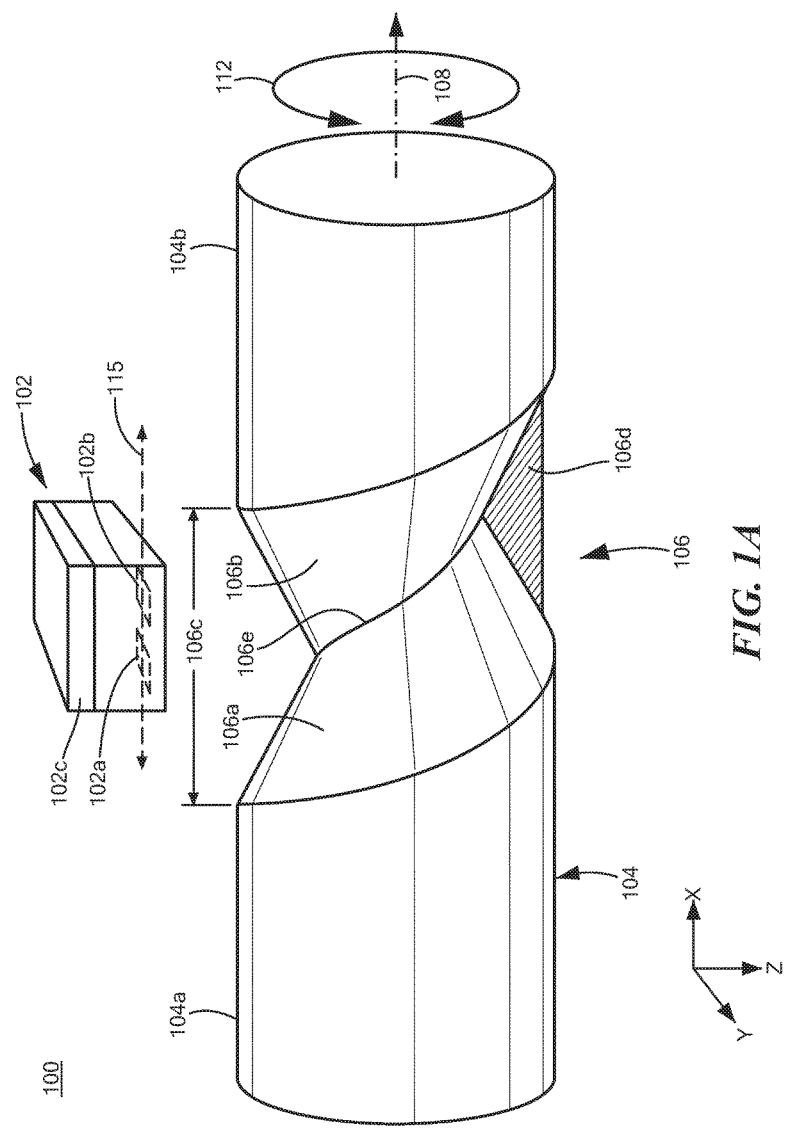
FIG. 1A is a diagram showing an illustrative system having a magnetic field sensor with two magnetic field sensing elements proximate to a target object with a helical groove.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. There are different types of Hall effect elements, for example, a planar Hall element, a vertical Hall element, and a Circular Vertical Hall (CVH) element. There are also different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element might be a single element or, alternatively, might include two or more magnetic field sensing elements arranged in various configurations, e.g., a half bridge or full (Wheatstone) bridge. Depending on the device type and other application requirements, the magnetic field sensing element might be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back bias or other magnet, and a magnetic field sensor that senses a magnetic field density of a magnetic field.

As used herein below, the term "target object" is used to describe a mechanical structure, movement of which is sensed by a magnetic field sensor.

As used herein, the term "groove" is used to describe a furrow or channel, for example, in a target object. The groove forms an indent in an outer surface of the target object. The groove can circumscribe the target object, extending around or upon all of, or a portion of, the outer surface of the target object. The groove might be V-shaped with flat first and second surfaces that intersect at a sharp vertex. Alternatively, the surfaces of the groove might not be flat and/or the vertex might not be sharp, but might instead be rounded or flat.

As used herein, the term "ridge" is used to describe a raised region, for example, in a target object. The ridge might typically extend above an outer surface of the target object. The ridge might circumscribe the target object, extending entirely around the target object, or might extend only around or extend upon only a portion of the outer surface of the target object. The ridge might be V-shaped with flat first and second surfaces that intersect at a sharp vertex. Alternatively, the surfaces of the ridge might not be flat and/or the vertex might not be sharp, but might instead be rounded or flat.

As used herein, the term "movement axis" is used to describe an axis along which a target object can move linearly relative to a location of a magnetic field sensor. The term "movement axis" is also used to describe an axis along which the magnetic field sensor can move linearly relative of a location of a ferromagnetic target object. In some arrangements, both the ferromagnetic target object and the magnetic field sensor can move relative to each other along respective movement axes.

As used herein, the term "movement line" is used to describe a line, which might be straight or curved, along which a target object can move relative to a location of a magnetic field sensor. The term "movement line" is also used to describe a line, straight or curved, along which the magnetic field sensor can move relative of a location of a ferromagnetic target object. In some arrangements, both the ferromagnetic target object and the magnetic field sensor can move relative to each other along respective movement lines.

It should be understood that a movement line can be a movement axis and a movement axis can be a movement line. However, a movement line can be curved while a movement axis is straight.

As used herein, the term "rotation axis" is used to describe an axis upon which a target object can rotate or spin. In some arrangements, the movement axis and the rotation axis are parallel to each other. In some arrangements, the movement axis and the rotation axis are the same axis. In some embodiments described herein, a target object can spin about a rotation axis and does not move along a movement line. In some embodiments described herein, a target object does not spin about a rotation axis but can move along a movement line. In some embodiments described herein, a target object can both spin about a rotation axis can move along a movement line.

Described embodiments measure an absolute relative angular position of a rotating shaft relative to a magnetic field sensor over a rotation range up to one hundred eighty degrees in some embodiments and over a rotation arrange of three hundred sixty degrees in other embodiments. By "absolute relative angular position," it is meant that one of or both of a magnetic field sensor and a shaft can rotate about a rotation axis (e.g., a relative position), and that an absolute position of the relative rotation can be determined (e.g., forty-five degrees). Embodiments can be employed for end of shaft and side shaft measurement. As described below, a magnetic field sensor is made of two magnetic field sensing elements (e.g., Hall elements) that are few millimeters away from each other and a back bias magnet. A target object made of ferromagnetic material (e.g., steel) can be disposed proximate to the magnetic field sensor. An output of the magnetic field sensor can be related to a difference of magnetic fields experienced by two Hall elements. Described embodiments provide specific target shapes that create a monotonic differential field at the magnetic field sensor location.

Referring to FIG. 1A, a sensing system 100 includes magnetic field sensor 102 disposed proximate to ferromagnetic target object 104. In some embodiments, magnetic field sensor 102 might include a back bias magnet 102c and two (or more) magnetic field sensing elements 102a and 102b disposed between ferromagnetic target object 104 and the back bias magnet 102c. In some embodiments, a magnetization direction of the magnet (and a direction of the sensed magnetic field) is substantially along the Z-axis as labelled in FIG. 1A.

Ferromagnetic target object 104 can include a helical groove 106 with a groove length 106c and with groove surfaces 106a and 106b intersecting at vertex 106e. As indicated by a flat region 106d, the helical groove 106 can extends only part way around a ferromagnetic target object 104, for example, one hundred eighty degrees around the ferromagnetic target object 104, and a back side behind the helical grove 106 can be, for example, flat.

As described in greater detail below in regard to FIG. 3, an output signal from magnetic field sensor 102 is representative of an absolute relative angle of ferromagnetic target object 104 relative to magnetic field sensor 102 in a direction about axis 108. In some embodiments, ferromagnetic target object 104 is operable to rotate or spin about rotation axis 108, as indicated by line 112.

Figure 1B:
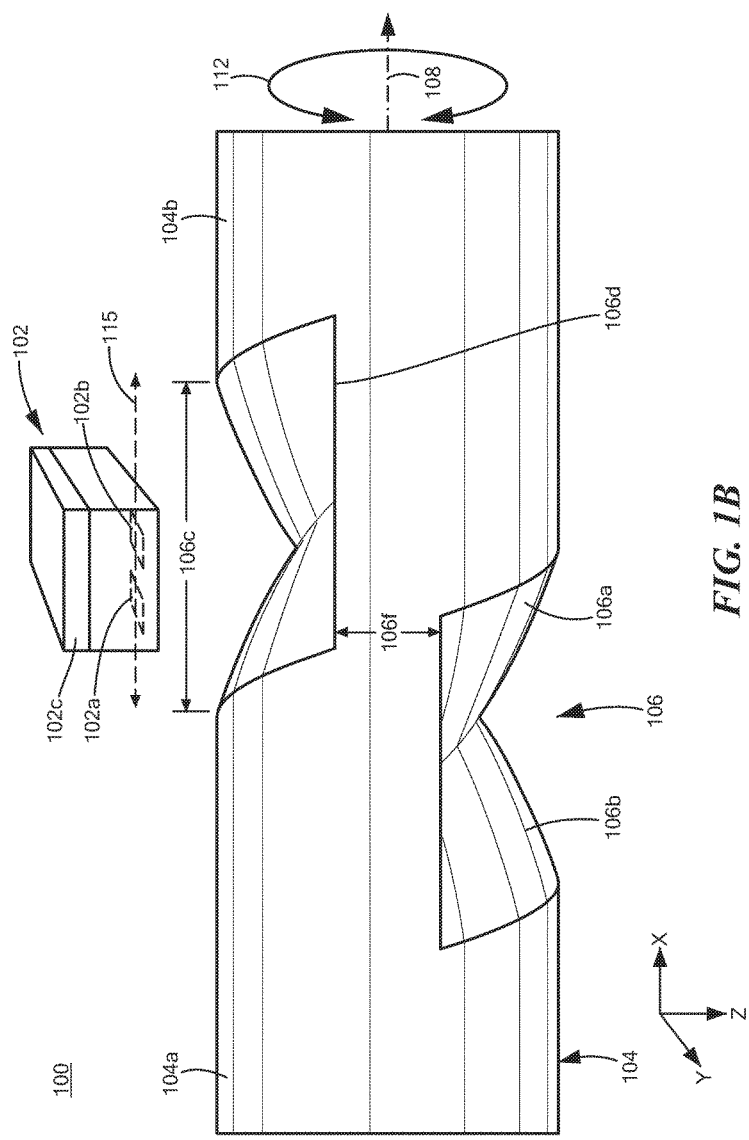
FIG. 1B is a diagram showing another view of the target object of FIG. 1A.

Referring to FIG. 1B, helical groove 106 extends only part way around ferromagnetic target object 104, for example, less than three hundred sixty degrees around the ferromagnetic target object 104, and a back side behind the helical grove 106 can be, for example, flat section 106d. As shown in FIG. 1A, flat section 106d has a width 106f that allows sensing system 100 to determine an absolute relative rotation of less than three hundred sixty degrees of ferromagnetic target object 104. In some embodiments, width 106f might be approximately ten degrees, such that sensing system 100 can determine an absolute relative rotation of three hundred fifty degrees of ferromagnetic target object 104.

Figure 2:
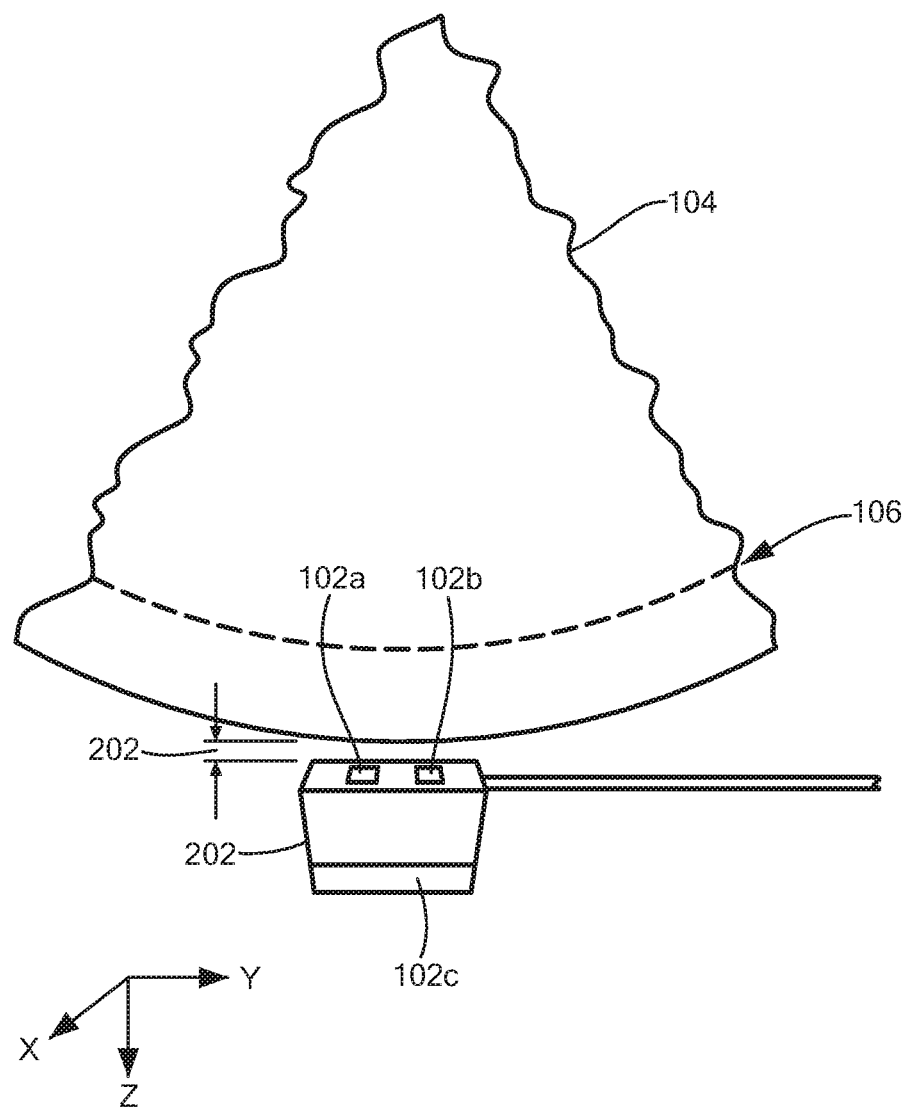
FIG. 2 is a side view of the target object and magnetic field sensor of FIGS. 1A and 1B.

Referring to FIG. 2, in which like elements of FIGS. 1A and 1B are shown having like reference designations, ferromagnetic target object 104 and magnetic field sensor 102 are separated by air gap 202. As described below, a dimension of air gap 202 is related to a magnitude of magnetic fields sensed by the magnetic field sensor 102. The air gap 202 is used in graphs below.

Figure 3:
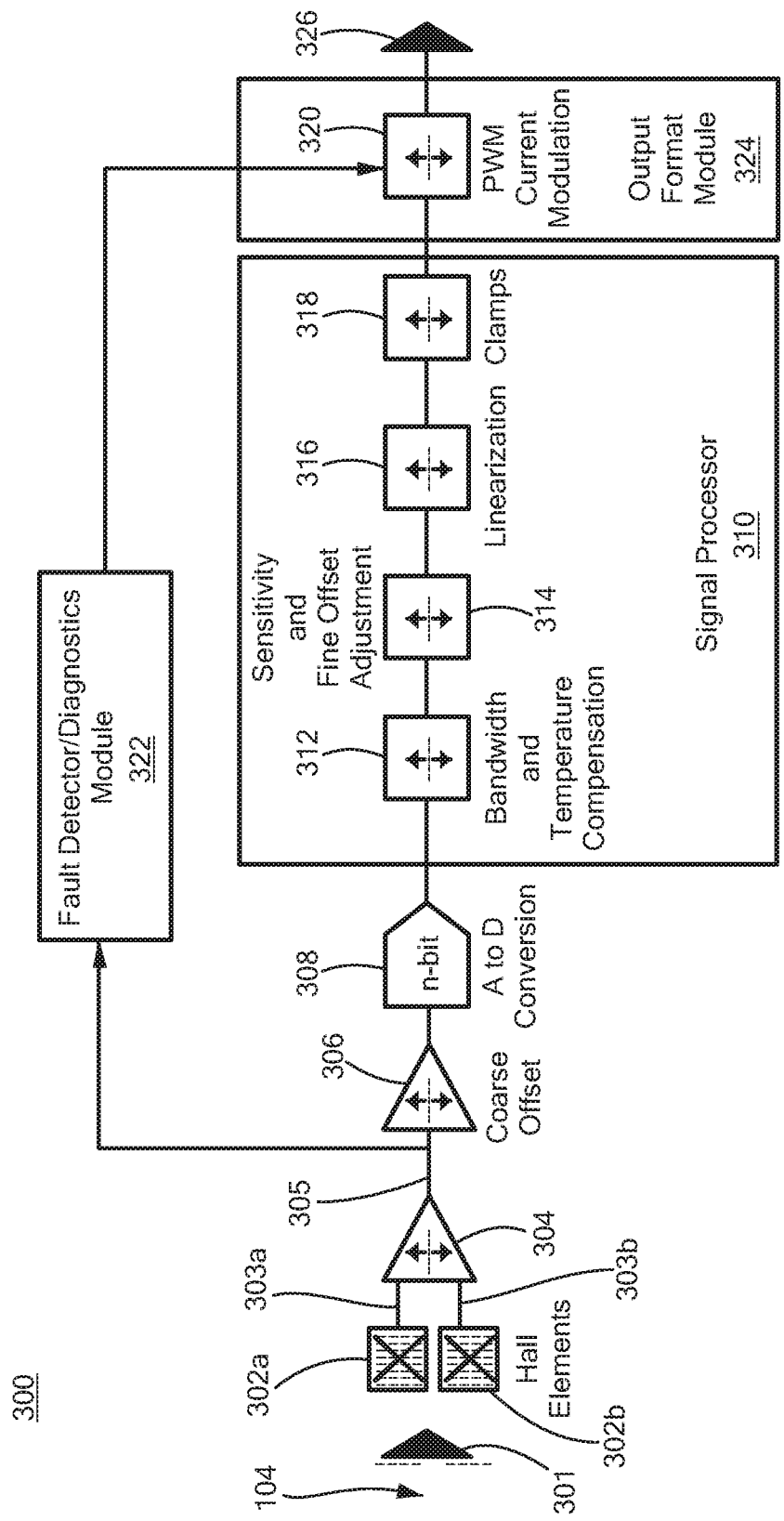
FIG. 3 is a schematic block diagram of an electronic circuit of the magnetic field sensor of the system of FIGS. 1A and 1B.

Referring to FIG. 3, an illustrative electronic circuit 300 can be disposed upon a substrate in magnetic field sensor 102. Electronic circuit 300 might include or be coupled to one or more magnetic field sensing elements (shown in FIG. 3 as magnetic field sensing elements 302a and 302b), which might be the same as or similar to the magnetic field sensing elements in each of the magnetic field sensors described herein.

Magnetic field sensing elements 302a and 302b experience a magnetic field (e.g., 301) in a back bias arrangement over groove 106 (e.g., as in magnetic field sensor 102 shown in FIGS. 1 and 2). The magnetic field (e.g., 301) generated by the back bias magnet 102c is influenced by the ferromagnetic target object 104. As ferromagnetic target object 104 rotates about rotation axis 108, a distance between magnetic field sensing elements 302a and 302b and helical groove 106 changes in different ways, resulting in magnetic field sensing elements 302a and 302b experiencing different magnitudes of magnetic fields as ferromagnetic target object 104 rotates.

Signals 303a and 303b from magnetic field sensing elements 302a and 302b, respectively, can be received by a differential amplifier 304. In some embodiments, adjustments might be made to operating parameters of differential amplifier 304 during a calibration period of electronic circuit 300. For example, differential amplifier 304 might include input range and coarse sensitivity adjustments.

Differential amplifier 304 generates difference signal 305, which might be received by coarse offset voltage adjustment circuit 306. Coarse offset adjustment circuit 306 can generate an offset adjusted signal, for example, such that an offset adjusted signal is within an operational range of N-bit analog-to-digital (A/D) converter 308. A/D converter 308, for example, a 14-bit A/D, can be coupled to receive the offset corrected signal and can generate a digital signal. The digital signal can be received by signal processor 310. Signal processor 310 might include a bandwidth and temperature compensation module 312. Bandwidth and temperature compensation module 312 might filter (e.g., with a selectable bandwidth) and temperature compensate the offset corrected signal. Signal processor 310 might also include sensitivity and fine offset adjustment module 314 that provides a fine sensitivity and offset adjustment.

In some embodiments, signal processor 310 might also include linearization module 316 coupled to sensitivity and fine offset adjustment module 314. Linearization module 316 might generate a linearized output signal with respect to absolute relative rotation between ferromagnetic target object 104 and electronic circuit 300. Signal processor 310 might also include a clamping module 318 coupled to receive the linearized output signal and to generate a clamped output signal. The clamped output signal might be a version of the linearized output signal restricted to a particular range of values. In some embodiments, electronic circuit 300 does not include linearization module 316, and instead, clamping module 318 couples to upstream circuits directly.

For embodiments in which magnetic field sensing elements 302a and 302b are Hall effect elements, electronic circuit 300 might include circuitry (not shown) to chop (or current spin) the Hall effect elements. Current spinning is a known circuit technique that can result in lower apparent offset voltages of Hall elements 302a and 302b.

Output format module 324 receives the clamped signal, and pulse width modulation (PWM) current modulator 320 can generate output signal 326 proportional to values of the clamped signal. In some embodiments, output signal 326 has a duty cycle proportional to values of the clamped signal. In some embodiments, output signal 326 is a current signal carried on a common wire with a supply voltage that powers electronic circuit 300.

In some embodiments, certain ranges of duty cycle of the PWM output signal 326 are used for other purposes. For example, duty cycles from zero to ten percent and duty cycles from ninety to one hundred percent might be used to signal fault conditions of electronic circuit 300. Thus, in some embodiments, clamping module 318 restricts values of clamped signal to those values that would generate duty cycles in a range from about ten to about ninety percent. However, other duty cycle ranges might alternatively be used.

To that end, electronic circuit 300 might include fault detector module 322 that can provide a fault signal to output format module 324. As shown, fault detector/diagnostics module 322 is coupled to the output of differential amplifier 304 and detects invalid levels of the difference signal 305. In other embodiments, fault detector/diagnostics module 322 might be coupled to other signals of electronic circuit 300 and might detect other types of error conditions. More generally, fault detector/diagnostics module 322 might monitor signal path validity and communicate fault condition(s) to the output. This is particularly important for automotive safety related applications requiring conformity to Automotive Safety Integrity Level (ASIL).

While output format module 324 is described to generate a PWM output signal, in other embodiments, output signal 326 might be generated in accordance with other formats, for example, a Single Edge Nibble Transmission (SENT) format, a Serial Peripheral Interface (SPI) format, a Local Interconnect Network (LIN) format, a CAN (Controller Area Network) format, an Inter-Integrated Circuit (I2C) format, or other similar signal formats. For example, in automotive applications, output signal 326 might be communicated to an Electronic/Engine Control Unit (ECU) or Engine Control Module (ECM) or similar controller of an automotive system.

Figure 4:
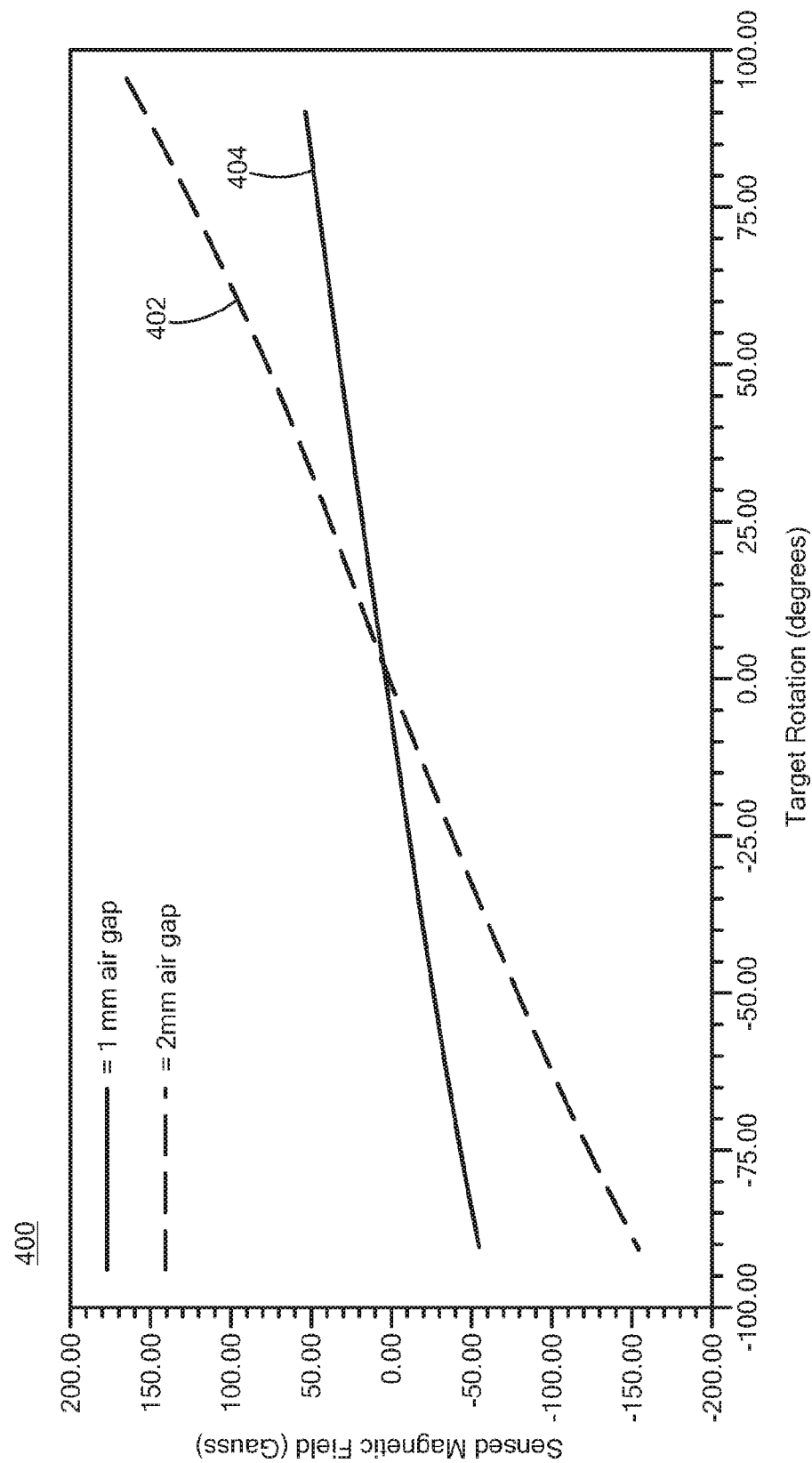
FIG. 4 is a graph showing plots of difference signals generated by the magnetic field sensor of FIGS. 1A and 1B, at two different air gaps between the magnetic field sensor and the target object, versus relative rotation of the target object of FIGS. 1A and 1B.

Referring to FIG. 4, graph 400 has a horizontal axis with a scale in units of degrees indicative of absolute relative rotation of a target object (e.g., target object 104) and a magnetic field sensor (e.g., magnetic field sensor 102 of FIGS. 1A and 1B, coupled to electronic circuit 300). Graph 400 has a vertical axis with a scale in units of the magnetic field (e.g., Gauss) sensed by the magnetic field sensor 102. Curves 402 and 404 are representative of difference signal 305 for two different air gaps (see air gap 202 of FIG. 2). For example, curve 402 is representative of the difference signal 305 for a 1 mm air gap (e.g., air gap 202 of FIG. 2) between the magnetic field sensor 102 and the target object 104 of FIGS. 1A and 1B. Curve 404 is representative of difference signal 305 for a 2 mm air gap (e.g., air gap 202 of FIG. 2) between the magnetic field sensor 102 and the target object 104 of FIGS. 1A and 1B.

It will be understood that linearity of the curves 402 and 404 can be influenced by a variety of circuits and factors. For example, the linearity can be affected by the shape of target object 104 (e.g., helical groove 106) and the signal processing performed by linearization module 316 of FIG. 3. In some embodiments, linearization is controlled by the shape of target object 104 (e.g., helical groove 106 in target object 104), and the linearization module 316 is not needed.

Thus, as shown in FIGS. 1-4, described embodiments employ a back bias magnet (e.g., 102c of FIGS. 1A and 1B) within or adjacent to a magnetic field sensor (e.g., 102) having two Hall sensing elements 102a and 102b that, for a stationary magnetic field sensor 102, measure a magnetic field in a direction along the Z-axis as shown in FIGS. 1 and 2. The two Hall sensing elements 102a and 102b are typically a few millimeters away from each other along the X-axis as shown in FIGS. 1 and 2. Each one of the magnetic field sensing elements 102a and 102b outputs a respective signal representative of a magnetic field experienced by each magnetic field sensing element. For example, magnetic field sensing element 302a outputs signal 303a, and sensing element 302b outputs signal 303b. The magnetic field sensor output signal 326 is representative of a difference (i.e., a differential arrangement) of the two signals (e.g., signal 303b minus signal 303a) performed by the differential amplifier 304.

The magnetic field sensor (e.g., 102 of FIGS. 1A and 1B), measures an absolute relative rotational position of a ferromagnetic target object (e.g., 104), e.g., a shaft, by either a side shaft measurement such as shown in FIGS. 1A and 1B, or by an end of shaft measurement such as described below in regard to FIG. 12. The ferromagnetic target object is made of a ferromagnetic material (e.g., steel) in order to influence a magnetic field generated by the back bias magnet (e.g., 102c of FIGS. 1A and 1B).

To detect the shaft position, described embodiments of the shaft have a target area (e.g., groove 106 with length 106c) proximate to magnetic field sensor 102. The target area has a specific shape (e.g., a helical groove) to create a monotonic differential field at magnetic field sensor 102 as the relative rotation changes. To detect an absolute position of the shaft, the differential field is beneficially unique for any rotational position of the shaft. Further, the differential field can be as linear as possible as the relative rotation changes to improve measurement accuracy and reduce post-processing requirements of signal processor 310.

In particular, the embodiment of shaft 104 shown in FIGS. 1A and 1B is beneficially employed in a side shaft absolute relative measurement arrangement. As shown in FIGS. 1A and 1B, the target area employs a V-shaped helical groove 106. In some embodiments, helical groove 106 might be similar to the threads of a screw. When shaft 104 rotates about the X-axis (e.g., as indicated by line 112), each of the magnetic field sensing elements 102a and 102b experience a varying distance to a surface of the helical groove 106 with opposite direction. As the shaft rotates, if magnetic field sensing element 102a experiences an increasing air gap, then magnetic field sensing element 102b experiences a decreasing air gap (and vice versa). Consequently, the differential field is monotonic and symmetric as shaft 104 rotates, as shown in FIG. 4.

To have a monotonic differential field, described embodiments can meet the following relationships:

$$L > 3S(1) \text{ and } P < \frac{180L}{\theta}, \tag{2}$$

where L is a length of the V-shape groove (e.g., dimension 106c of FIGS. 1A and 1B), S is a spacing between magnetic field sensing elements 102a and 102b, θ is a maximum rotation range (in degrees), and P is a screw pitch of helical groove 106. Curves 402 and 404 of FIG. 4 represent signals generated by magnetic field sensor 102 (e.g., difference signal 305 of FIG. 3) having two different air gaps (e.g., air gap 202 having dimensions of 1 mm for curve 404 and 2 mm for curve 404), which are shown in FIG. 4 for a +/−ninety degree rotation. As shown in FIG. 4, curves 402 and 404 are monotonic and exhibit high linearity over at least +/−ninety degrees (i.e., over a range of one hundred eighty degrees).

It should be understood that the magnetic field sensor 102 of the shaft 104 of FIGS. 1A and 1B can be at different positions (or move) in the x direction and still achieve the results of FIG. 4, so long as the magnetic field sensing elements 102a and 102b remain over the groove 106. This is due to the differential arrangement provided by the two magnetic field sensing elements 102a and 102b in combination with differential amplifier 304. In particular, the shape of groove 106 is such that the distance between magnetic field sensing element 102a and groove surface 106a is increasing while the distance between magnetic field sensing element 102b and groove surface 106b is decreasing, and vice versa.

Other shapes of target object 104 and helical groove 106 might improve linearity of the sensed magnetic field (e.g., difference signal 305 of FIG. 3) over a rotation of a target object. For example, it is possible to improve or otherwise change the linearity by employing a rounded V-shape as shown in FIG. 5A or a ridge-shape as shown in FIG. 5B.

Figure 5A:
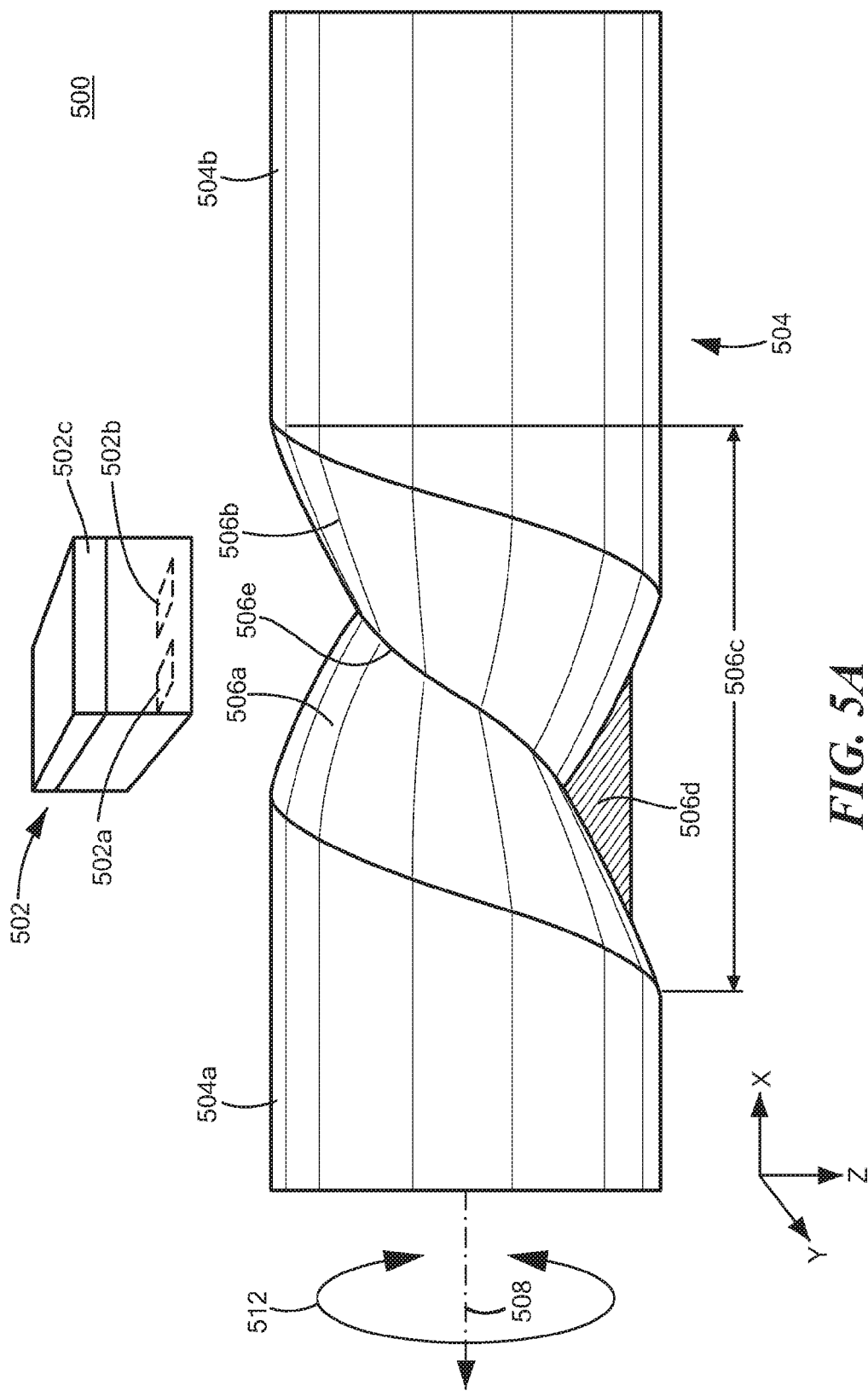
FIG. 5A is a diagram showing another illustrative system having a magnetic field sensor with two magnetic field sensing elements proximate to another target object with a different helical groove.
Figure 5B:
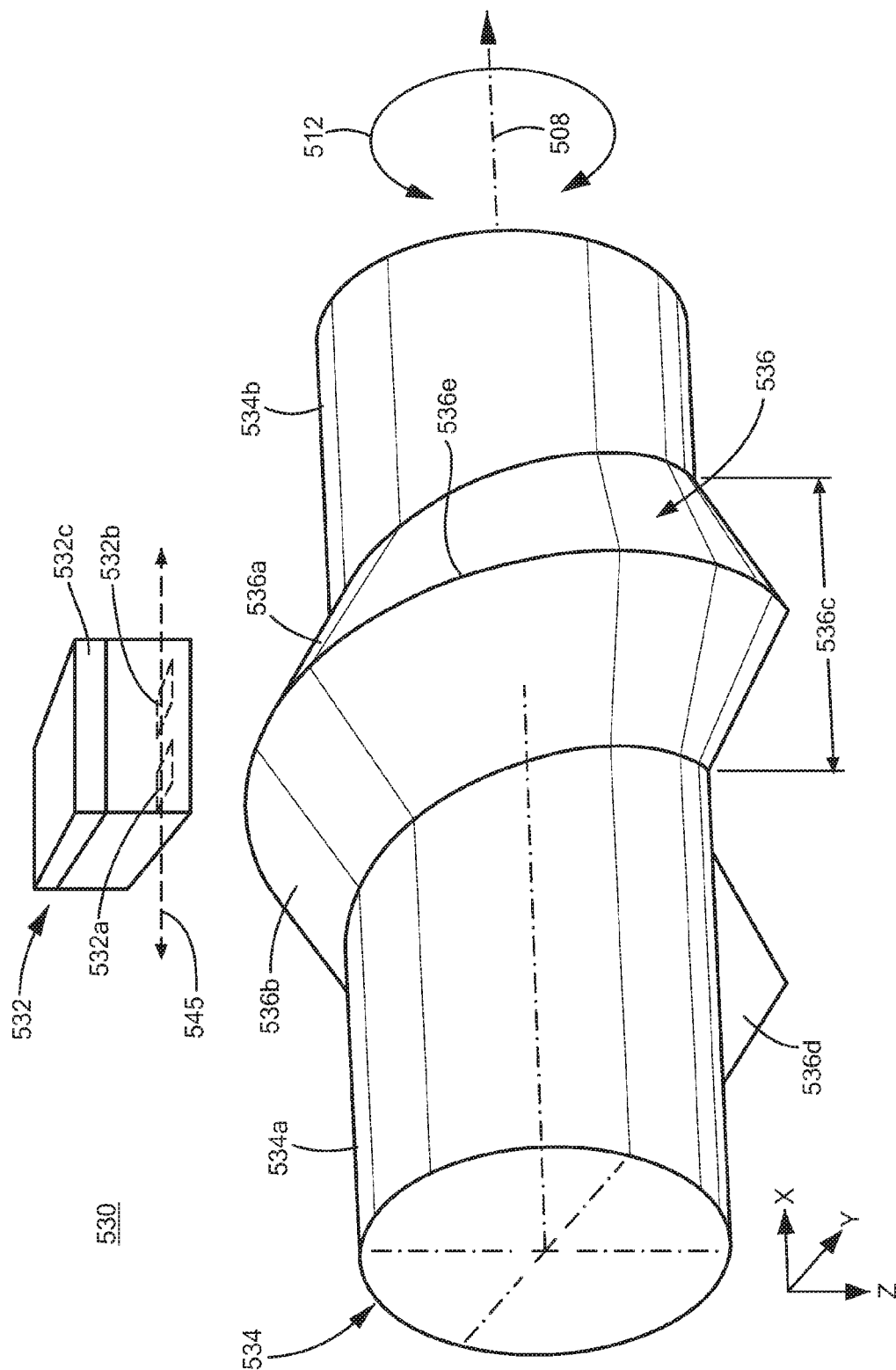
FIG. 5B is a diagram showing another illustrative system having a magnetic field sensor with two magnetic field sensing elements proximate to another target object with a helical ridge.

As shown in FIG. 5A, a sensing system 500 includes magnetic field sensor 502 disposed proximate to ferromagnetic target object 504. In some embodiments, magnetic field sensor 502 might include a back bias magnet 502c and two (or more) magnetic field sensing elements 502a and 502b disposed between ferromagnetic target object 504 and the back bias magnet 502c.

Ferromagnetic target object 504 can include a helical groove 506 with a groove length 506c and with surfaces 506a and 506b intersecting at a vertex 506e. As indicated by a flat region 506d, the helical groove 506 extends only part way around the ferromagnetic target object 504, for example, less than three hundred sixty degrees around the ferromagnetic target object 504, and a back side behind the helical grove 506 can be, for example, flat.

Figure 6A:
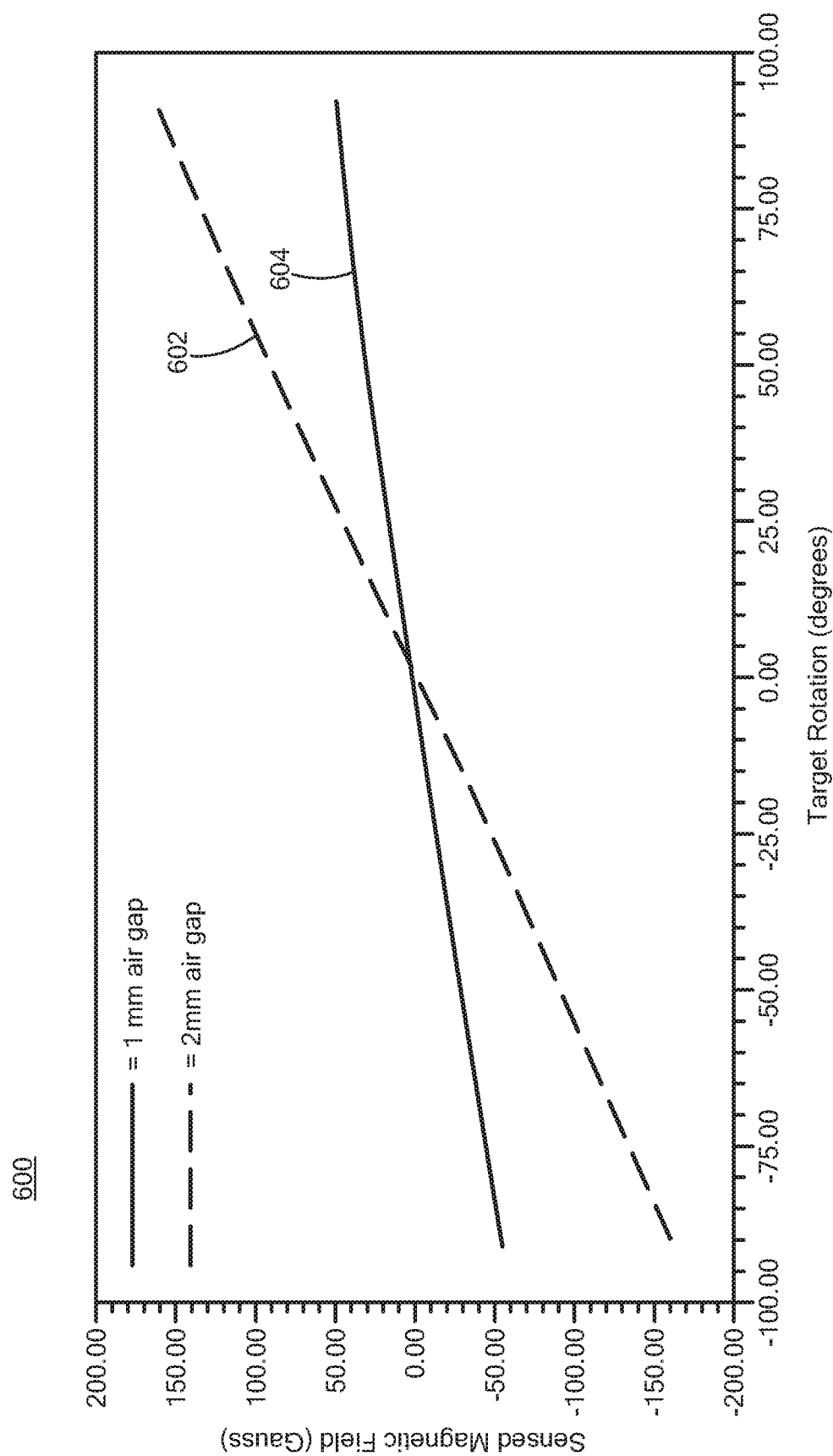
FIG. 6A is a graph showing plots of difference signals generated by the magnetic field sensor of FIG. 5A, at two different air gaps between the magnetic field sensor and the target object, versus relative rotation of the target object of FIG. 5A.

The shaft 504 has a rounded helical groove 506 where a slope of the surfaces 506a, 506b are curved as shown. The better linearity is shown in FIG. 6A, where the magnetic field sensor 502, for both a 1 mm air gap (e.g., curve 604) and a 2 mm air gap (e.g., curve 602) exhibits improved linearity over a shaft having a straight V-shape (e.g., curves 404 and 402 of FIG. 4).

As shown in FIG. 5B, a sensing system 530 includes magnetic field sensor 532 disposed proximate to ferromagnetic target object 534. In some embodiments, magnetic field sensor 532 might include a back bias magnet 532c and two (or more) magnetic field sensing elements 532a and 532b disposed between ferromagnetic target object 534 and the back bias magnet 532c.

Ferromagnetic target object 534 can include a helical ridge 536 with a ridge length 536c and with surfaces 536a and 536b intersecting at a vertex 536e. As indicated by a flat region 536d, the helical ridge 536 extends only part way around the ferromagnetic target object 534, for example, less than three hundred sixty degrees around the ferromagnetic target object 534, and a back side behind the helical ridge 536 can be, for example, flat.

Figure 6B:
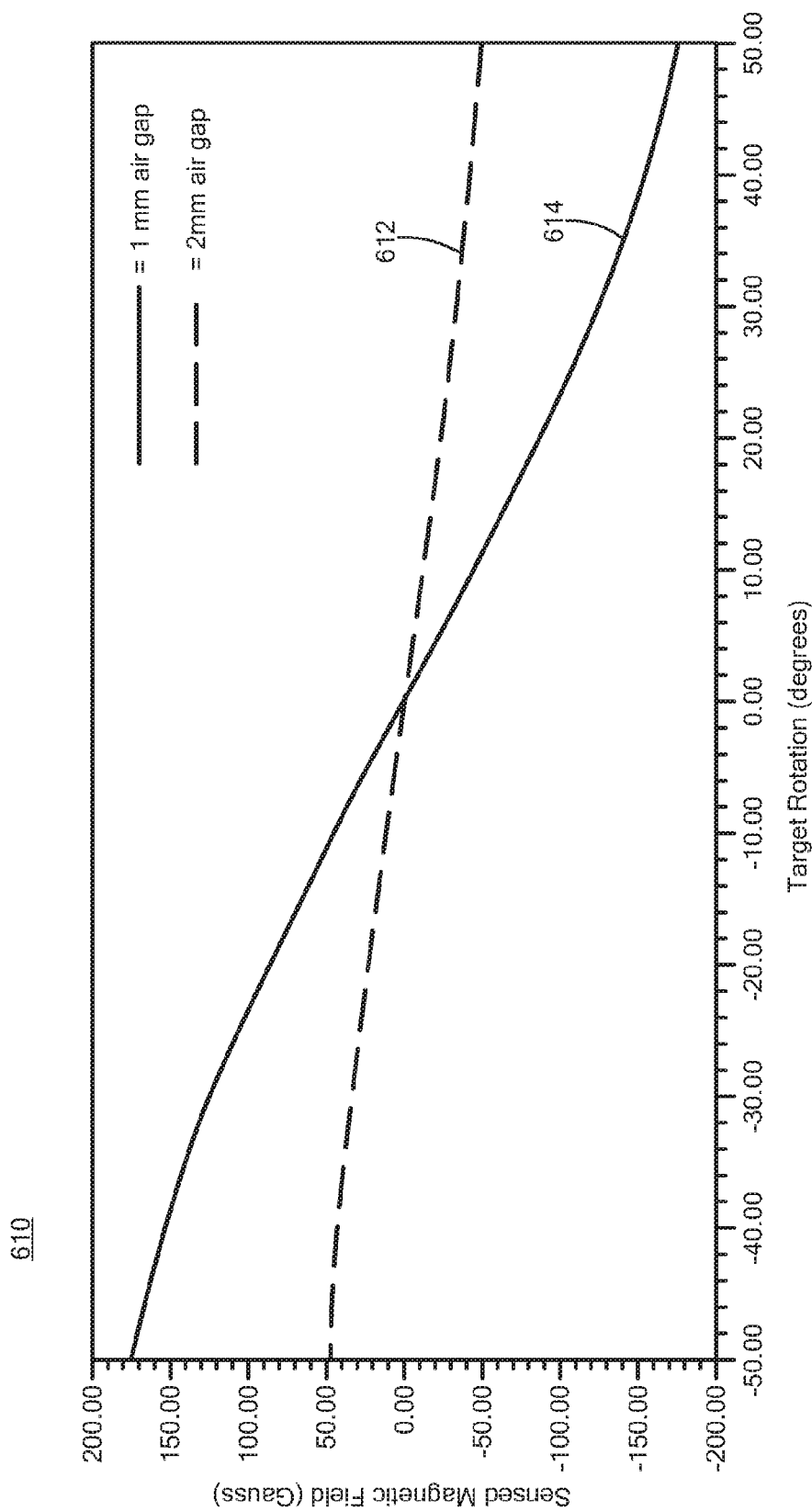
FIG. 6B is a graph showing plots of difference signals generated by the magnetic field sensor of FIG. 5B, at two different air gaps between the magnetic field sensor and the target object, versus relative rotation of the target object of FIG. 5B.

The shaft 534 has the helical ridge 536 where a slope of the surface 536a is curved as shown. FIG. 6B shows the differential magnetic field sensed by magnetic field sensor 532, for both a 1 mm air gap (e.g., curve 614) and a 2 mm air gap (e.g., curve 612), which exhibits reasonable linearity in comparison to shafts having a helical groove (e.g., curves 404 and 402 of FIG. 4, and curves 604 and 602 of FIG. 6A, for example).

It should be noted that described embodiments above, for which helical groves (or ridges) do not extend all the way around respective shafts, it is not possible to measure rotation through a range of three hundred sixty degrees. To achieve measurements over rotations of up to and beyond three hundred sixty degrees, the differential field experienced by the magnetic field sensor (e.g., magnetic field sensor 502) needs to be periodic, symmetric and monotonic over a rotation of one hundred eighty degrees.

FIG. 7A shows a sensing system 700 that includes magnetic field sensor 702 disposed proximate to ferromagnetic target object 704. In some embodiments, magnetic field sensor 702 might include a back bias magnet 702c and two (or more) magnetic field sensing elements 702a and 702b disposed between ferromagnetic target object 704 and the back bias magnet 702c.

Ferromagnetic target object 704 can include a helical groove 706 with a groove length 706c and with surfaces 706a and 706b. Unlike the helical grooves 106 and 506 above, the helical groove 706 extends all the way around a shaft 704, in two conjoined groove portions. Only one conjoined groove portion is shown and another conjoined portion is behind the view shown.

Thus, an illustrative shaft 704 has a screw type helical groove 706 having a first symmetric groove portion 710a and a second symmetric groove portion 710b, which is in the back and not shown in detail. Thus, shaft 704 exhibits symmetry over two rotational ranges, zero degrees to one hundred eighty degrees and one hundred eighty degrees to three hundred sixty degrees.

Figure 7B:
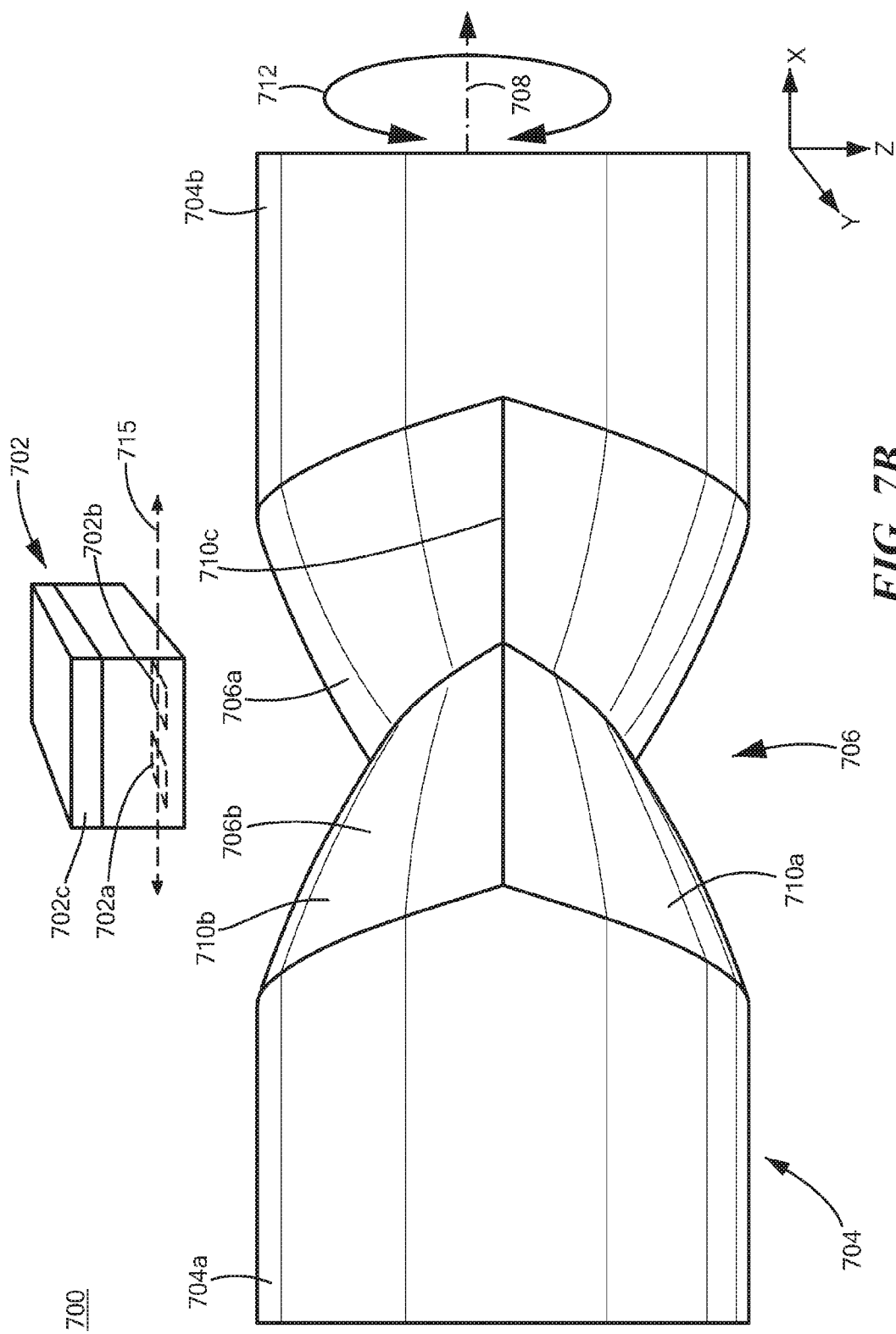
FIG. 7B is a diagram showing another view of the target object of FIG. 7A.

FIG. 7B shows another view of sensing system 700. As shown in FIG. 7B, ferromagnetic target object 704 includes helical groove 706 with surfaces 706a and 706b. Helical groove 706 extends all the way around shaft 704, in two symmetric conjoined groove portions, 710a and 710b, which are conjoined at seam 710c. Thus, helical groove 706 and, thus, shaft 704, exhibits symmetry over two rotational ranges, zero degrees to one hundred eighty degrees and one hundred eighty degrees to three hundred sixty degrees (e.g., over portions 710a and 710b, separated by seam 710c).

Figure 8:
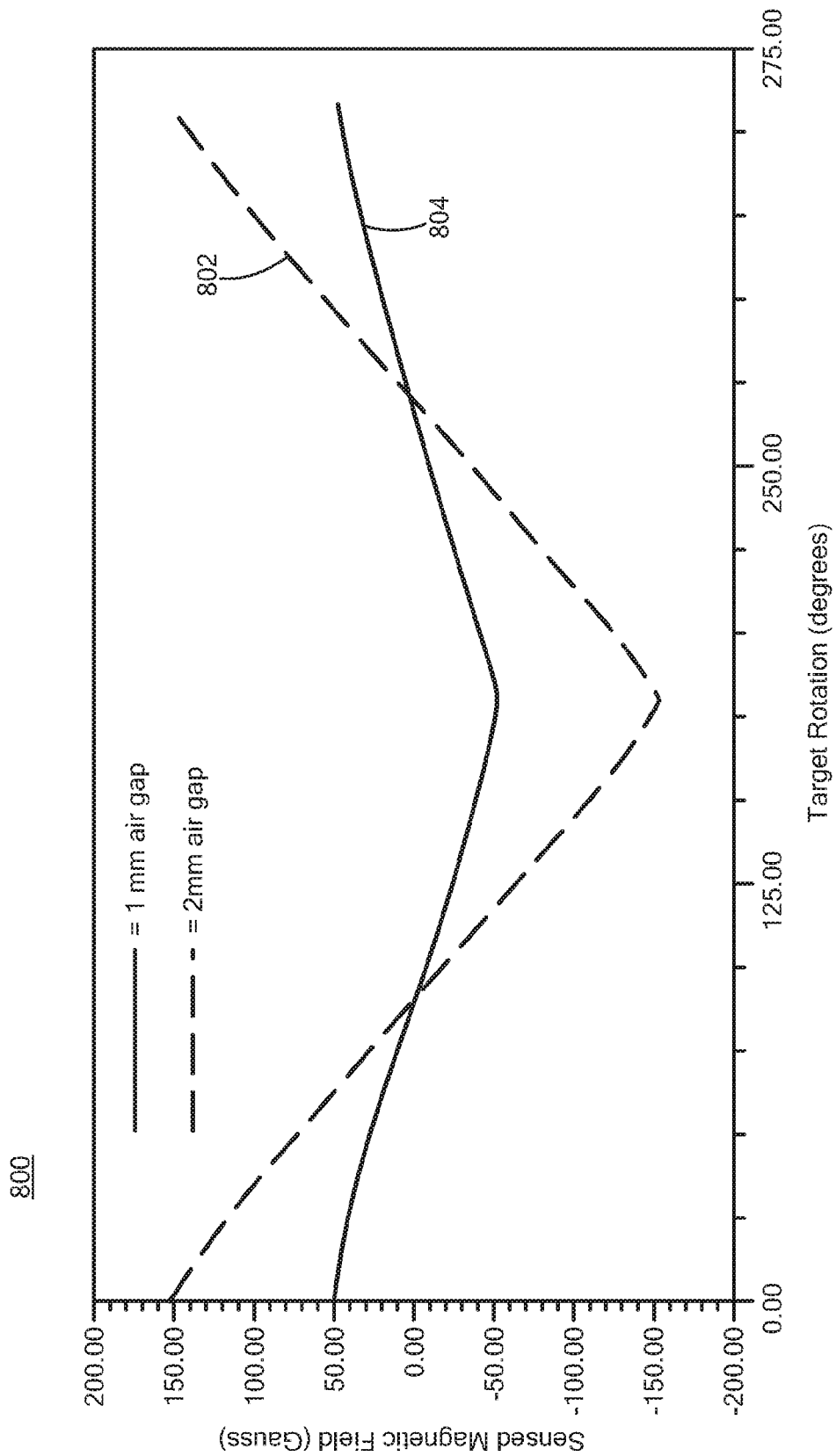
FIG. 8 is a graph showing plots of difference signals generated by the magnetic field sensor of FIG. 7A, at two different air gaps between the magnetic field sensor and the target object, versus relative rotation of the target object of FIG. 7A.

FIG. 8 shows curve 804 representative of the difference signal 305 for a 1 mm air gap (e.g., air gap 202 of FIG. 2) between the magnetic field sensor 702 and the target object 704 of FIG. 7A. Curve 802 is representative of difference signal 305 for a 2 mm air gap (e.g., air gap 202 of FIG. 2) between the magnetic field sensor 702 and the target object 704 of FIG. 7A. As shown, the signals exhibit symmetry about one hundred eighty degrees.

Assuming that an initial position of shaft 704 is known (e.g., whether groove portion 710a or 710b is facing magnetic field sensor 702), it is possible to measure the absolute position of shaft 704 by detecting transitions between groove portions (e.g., 710a and 710b). If the initial position of shaft 704 is not known (e.g., it is not known which of groove portions 710a or 710b are initially facing magnetic field sensor 702), then the position of shaft 704 is known relative to a +/−one hundred eighty degree shift. Detecting transitions between groove portions 710a and 710b could be done, for example, by a peak detector module (not shown) of electronic circuit 300. Further, the absolute position detection does not require a rotation direction change of the shaft.

For example, a function θ gives the position within one of the one hundred eighty degree groove portions 710a and 710b as a function of the differential field AB experienced by magnetic field sensor 702 over rotation of the groove portions 710a and 710b (e.g., the portions of curves 802 and 804 from zero degrees to one hundred eighty degrees in FIG. 8). Then the absolute position, $\theta_{abs}$, of the shaft is given by $\theta_{abs}=\theta(\Delta B)$ in the groove portion representing zero degrees to one hundred eighty degrees, and by $\theta_{abs}=360°-\theta(\Delta B)$ in the groove portion representing one hundred eighty degrees to three hundred sixty degrees.

In some embodiments, the magnetic field sensor is twisted around the Z-axis at an angle between zero degrees and ninety degrees (not shown). However, such a twisted sensor might have reduced measurement range versus a non-twisted sensor.

Figure 9:
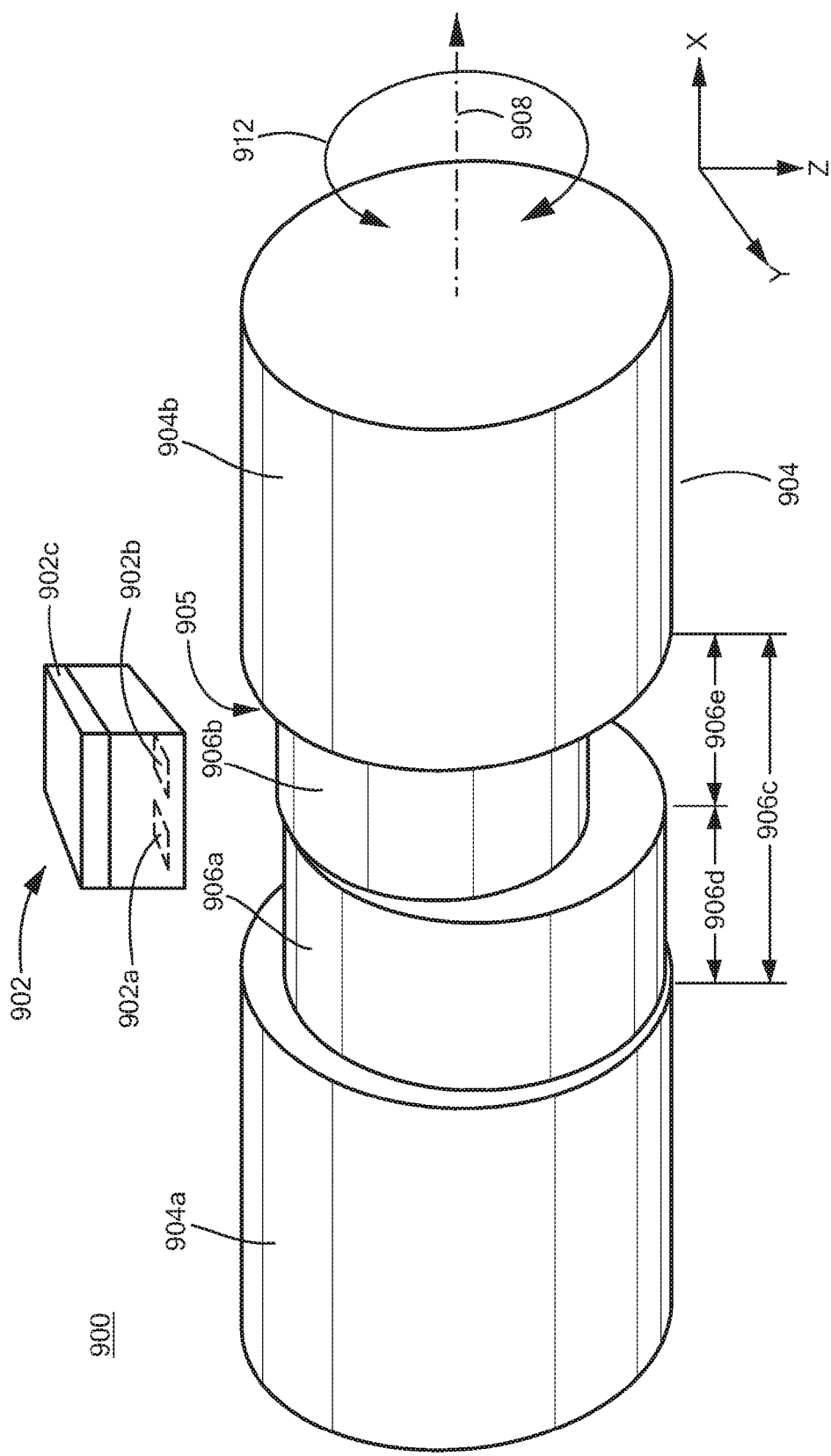
FIG. 9 is a diagram showing another illustrative system having a magnetic field sensor with two magnetic field sensing elements proximate to a target object with offset spiral segments.

Referring to FIG. 9, a sensing system 900 includes magnetic field sensor 902 having two magnetic field sensing elements 902a and 902b disposed proximate to ferromagnetic target object 904 for side shaft measurement. In some embodiments, magnetic field sensor 902 is proximate to (or includes) back bias magnet 902c. The ferromagnetic target object 904 can have two segments 906a and 906b, each having a radius that changes in a direction around a rotation axis 908. One magnetic field sensing element 902a is aligned with shaft segment 906a and another magnetic field sensing element 902b is aligned with shaft segment 906b. Each of shaft segments 906a and 906b has a different shape (e.g., radius) based on a decreasing spiral such that, as the ferromagnetic target object 904 turns, one magnetic field sensing element 902a has a decreasing distance to shaft segment 906a while the other magnetic field sensing element 902b has an increasing distance to the shaft segment 906b. Such embodiments can employ a target area 906 having an overall length 906c that is smaller than a comparable length of a helical groove shown in embodiments above.

Figure 10:
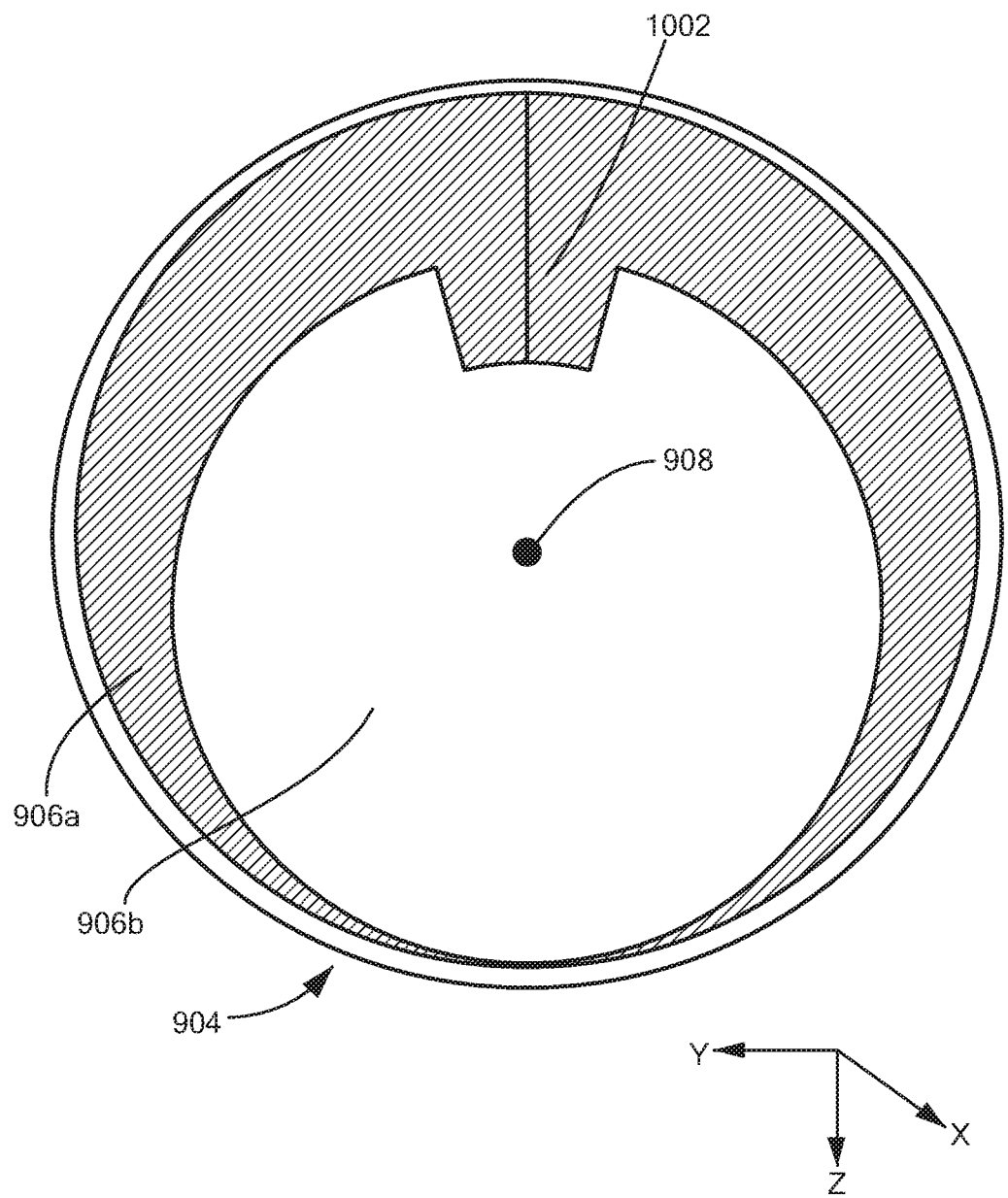
FIG. 10 is a diagram showing a cross-sectional view of the target object of FIG. 9.

FIG. 10, in which elements of FIG. 9 are shown having like reference designations, shows a cross-sectional view of shaft 904 of FIG. 9 taken at the interface between segments 904b and 906b, as indicated by line 905. As shown in FIG. 10, each of shaft segments 906a and 906b has a different shape (e.g., radius) based on a decreasing spiral such that the distance for one magnetic field sensing element is decreasing while the distance for the other magnetic field sensing element is increasing.

Figure 11:
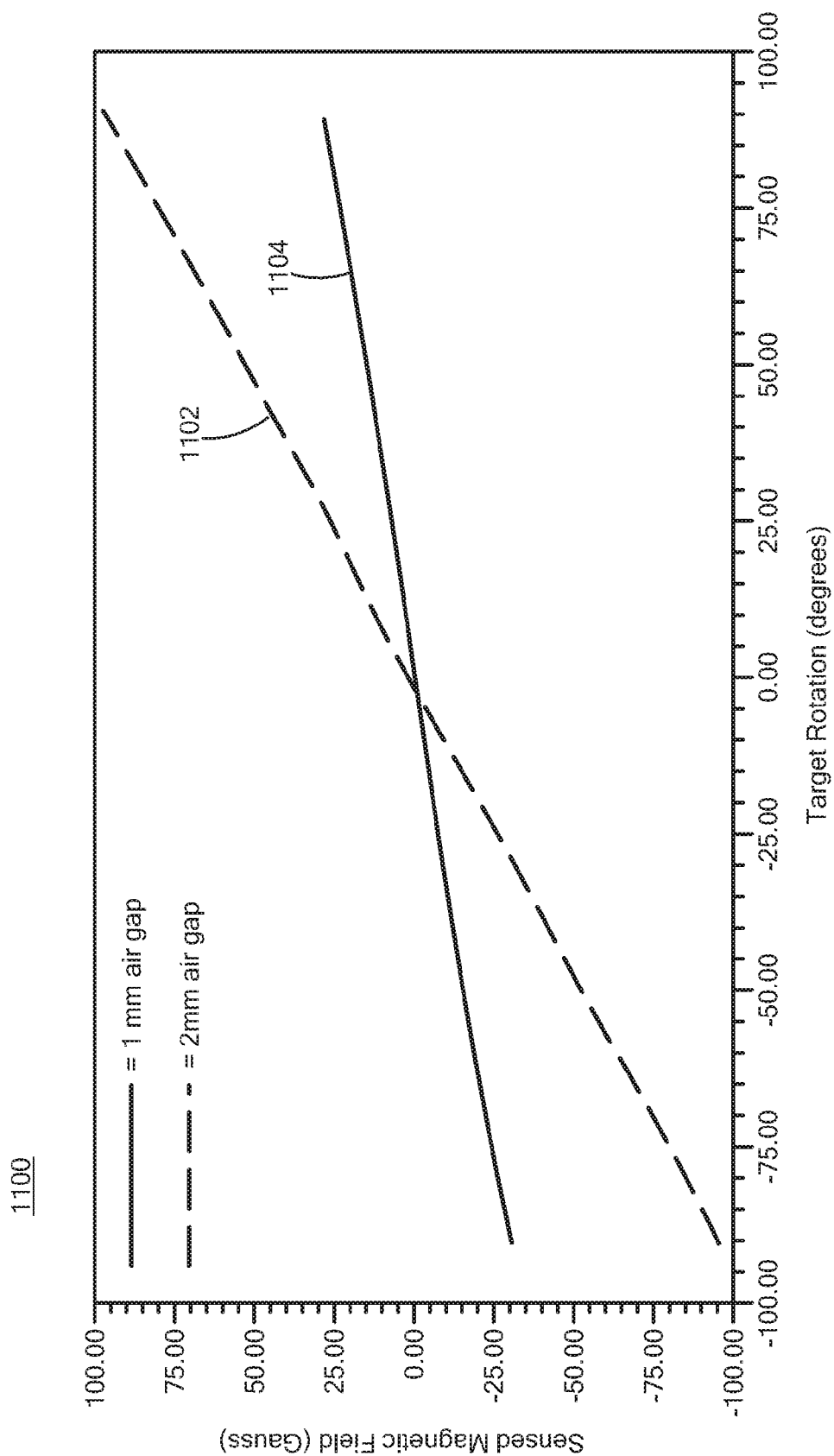
FIG. 11 is a graph showing plots of difference signals generated by the magnetic field sensor of FIGS. 9 and 10, at two different air gaps between the magnetic field sensor and the target object, versus relative rotation of the target object of FIGS. 9 and 10.

Referring now to FIG. 11, as shown by curves 1102 and 1104, the magnetic field sensor 902 of FIG. 9 can generate the difference signal 305 that exhibits good linearity over a at least a +/−ninety degree rotation (i.e., over a range of at least one hundred eighty degrees).

The principles described above in regard to side-shaft measurement can also be applied to end-of-shaft measurements of absolute rotation position using specific target shapes described below.

Figure 12:
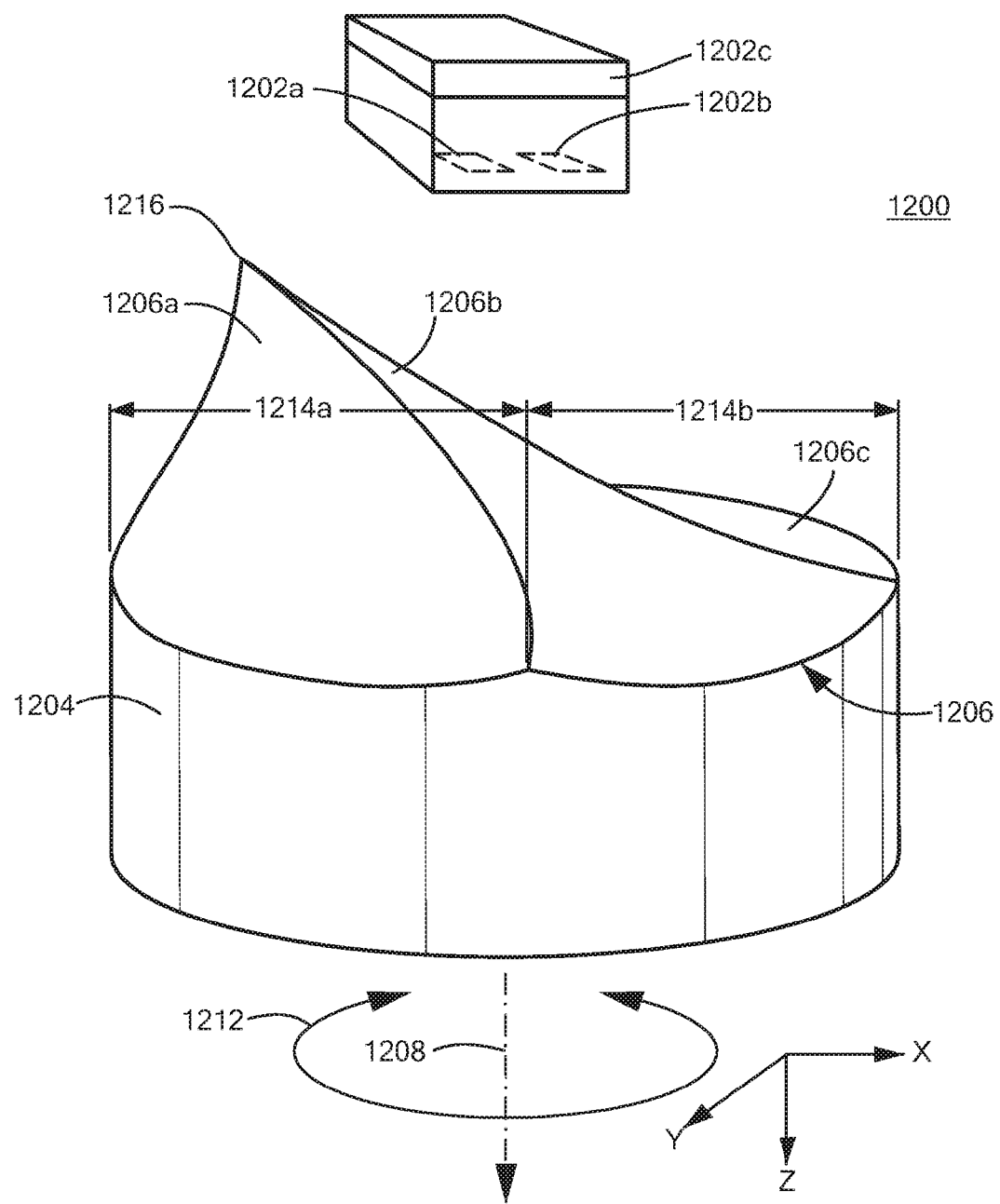
FIG. 12 is a diagram showing another illustrative system having a magnetic field sensor with two magnetic field sensing elements proximate to a target object located at an end of a rotating shaft.

Referring now to FIG. 12, sensing system 1200 for end-of-shaft measurements includes magnetic field sensor 1202 having two magnetic field sensing elements 1202a and 1202b and a back bias magnet 1202c. Magnetic field sensor 1202 is disposed proximate to ferromagnetic target object 1204 (e.g., a rotating shaft having a target area 1206 located at the end of the shaft). As shown in FIG. 12, target area 1206 includes a plurality of target segments 1206 (shown as target segments 1206a, 1206b and 1206c, although other numbers of segments might be employed). As indicated by line 1212, shaft 1204 rotates about rotation axis 1208. Magnetic field sensing elements 1202a and 1202b sense rotation of ferromagnetic target object 1204 as the sensed magnetic field changes with respect to the shape of target segments 1206a, 1206b and 1206c. For example, as shown in FIG. 12, target segments 1206a, 1206b and 1206c each have a starting width (1214a, 1214b and 1214c, respectively) and taper to a point at the distal end of target area 1206 (e.g., point 1216). Each of target segments 1206a, 1206b and 1206c have a slope of the taper to point 1216. In some embodiments, each of target segments 1206a, 1206b and 1206c might have a different width and slope of the tapers to ease detection of each segment by magnetic field sensing elements 1202a and 1202b.

Figure 13:
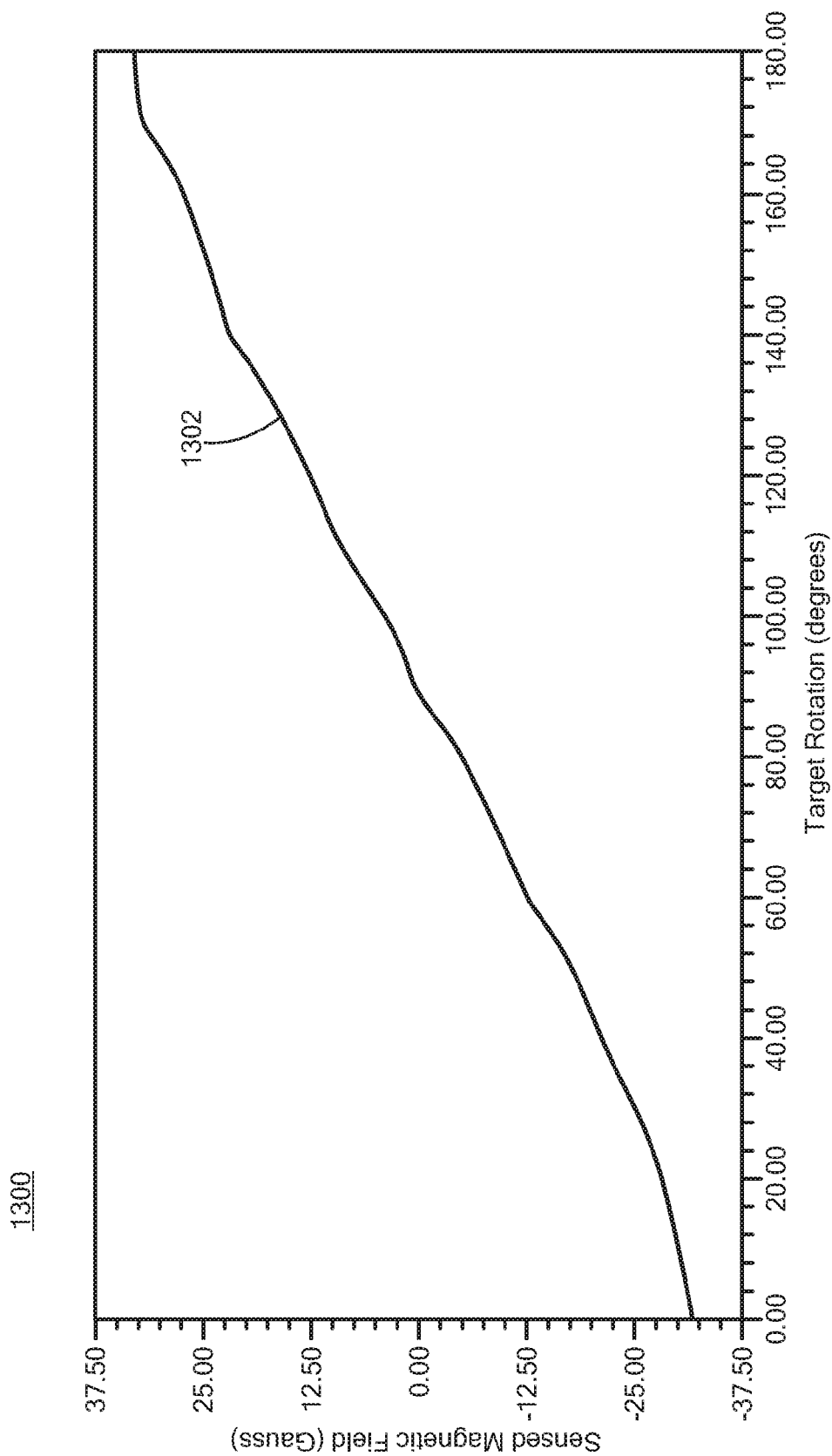
FIG. 13 is a graph showing a plot of a difference signal generated by the magnetic field sensor of FIG. 12, versus relative rotation of the target object of FIG. 12.

FIG. 13 shows curves representative of signals that can be generated by the magnetic field sensor 1202 over a one hundred eighty degree rotation of shaft 1204. As shown by curve 1302, symmetry of target segments 1206a-1206c allows the magnetic field sensor 1202 to exhibit linearity over at least one hundred eighty degree rotation of shaft 1204.

For end shaft and side shaft measurement, the sensed magnetic field can be linear if the target is correctly designed. Described designs of the target provide improved linearity of the output of the magnetic field sensor that reduce, or ideally eliminate, the need for post-processing (e.g., by signal processor 310) to linearize the output. Further, described embodiments do not require complex integrated 2D/3D magnetic field measurement devices, zero gauss magnets or magnets of complex shapes.

Figure 14:
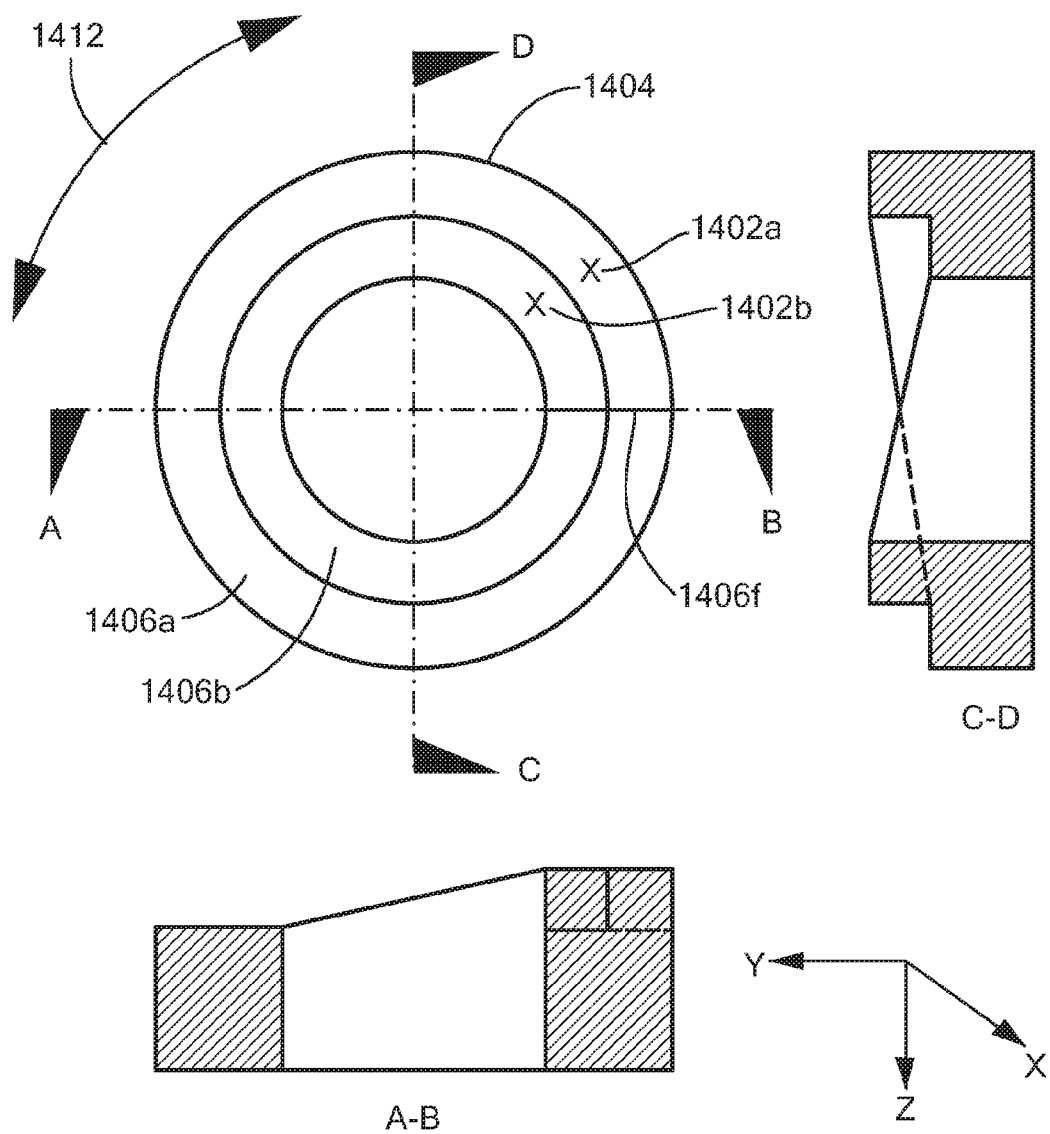
FIG. 14 is a diagram showing another illustrative system having a magnetic field sensor proximate to a target object located at an end of a rotating shaft.

Referring now to FIG. 14, sensing system 1400 for end-of-shaft measurements includes ferromagnetic target object 1404 (e.g., a rotating shaft) having a target area 1406 located at the end of the shaft. Cross-sectional views are shown respective to line A-B and line C-D. As shown in FIG. 14, target area 1406 includes target segments (or tracks) 1406a and 1406b. A magnetic field sensor has magnetic field sensors (e.g., 1402a and 1402b) aligned over the target tracks to sense rotation of ferromagnetic target object 1404. The sensed differential magnetic field changes with respect to the distance between magnetic field sensing elements 1402a and 1402b and target tracks 1406a and 1406b.

To achieve good linearity, each of target tracks 1406a and 1406b has a variable slope that changes in a direction around a rotation axis. In some embodiments, target tracks 1406a and 1406b are of opposite slopes. For example, each of target tracks 1406a and 1406b has a different slope such that, as ferromagnetic target object 1404 turns, one magnetic field sensing element 1402a has a decreasing distance to target track 1406a (and decreasing slope of the target track) while the other magnetic field sensing element 1402b has an increasing distance to target track 1406b (and increasing slope of the target track), until the ends of the tracks are reached, for example at seam 1406f.

Figure 15:
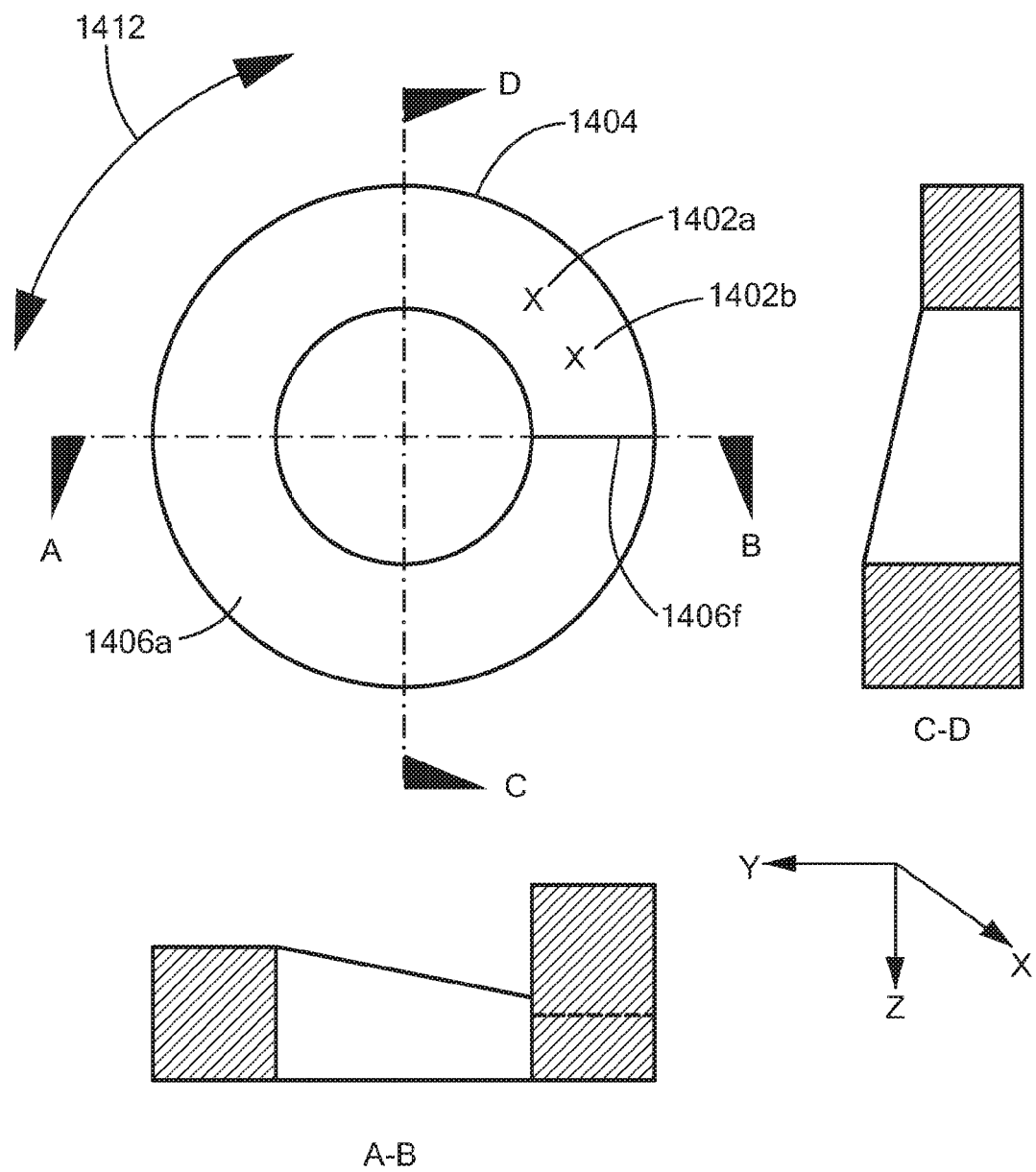
FIG. 15 is a diagram showing another illustrative system having a magnetic field sensor proximate to a target object located at an end of a rotating shaft.

FIG. 15, in which elements of FIG. 14 are shown having like reference designations, shows a cross-sectional view of an alternative embodiment of shaft 1404 of FIG. 14 having only a single target track 1406a. Sectional views are shown respective to line A-B and line C-D. As shown in FIG. 14, magnetic field sensing elements 1402a and 1402b are disposed over separate locations of target track 1406a. In some embodiments, target track 1406a has a different slope (e.g., a slope gradient) such that as the distance between the magnetic field sensing elements 1402a and 1402b and the target track is decreasing, the slope of the target track is also decreasing, and that the change in slope allows a difference signal to be detected between the magnetic fields sensed by magnetic field sensing elements 1402a and 1402b. Other embodiments might have a constant slope as the sensed magnetic field has a decreasing slope, which has a gradient.

Target track 1406a ends at seam 1406f. Magnetic field sensing elements 1402a and 1402b are aligned over single target track 1406a with a determined distance separating the two magnetic field sensing elements 1402a and 1402b.

Described embodiments are fully differential and employ back bias magnets and ferromagnetic targets. In some embodiments, the magnet can be integrated in the package with the magnetic field sensor. Described embodiments have no upper limit for the sensed magnetic field level.

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing the embodiments and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Moreover, the terms "system," "component," "module," "interface,", "model" or the like are generally intended to refer to a computer-related entity, either hardware, a combination of hardware and software, software, or software in execution. For example, a component might be, but is not limited to being, a process running on a processor, a processor, an object, an executable, a thread of execution, a program, and/or a computer. By way of illustration, both an application running on a controller and the controller can be a component. One or more components might reside within a process and/or thread of execution and a component might be localized on one computer and/or distributed between two or more computers.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC). In some embodiments, the "processor" can be embodied in a microprocessor with associated program memory. In some embodiments, the "processor" can be embodied in a discrete electronic circuit. The "processor" can be analog, digital or mixed-signal.

While the illustrative embodiments have been described with respect to processes of circuits, described embodiments might be implemented as a single integrated circuit, a multi-chip module, a single card, or a multi-card circuit pack. Further, as would be apparent to one skilled in the art, various functions of circuit elements might also be implemented as processing blocks in a software program. Such software might be employed in, for example, a digital signal processor, micro-controller, or general purpose computer.

Some embodiments might be implemented in the form of methods and apparatuses for practicing those methods. Described embodiments might also be implemented in the form of program code embodied in tangible media, such as magnetic recording media, hard drives, floppy diskettes, magnetic tape media, optical recording media, compact discs (CDs), digital versatile discs (DVDs), solid state memory, hybrid magnetic and solid state memory, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a processing device, the program code segments combine with the processor to provide a unique device that operates analogously to specific logic circuits. Such processing devices might include, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of the above. Described embodiments might also be implemented in the form of a bitstream or other sequence of signal values electrically or optically transmitted through a medium, stored magnetic-field variations in a magnetic recording medium, etc., generated using a method and/or an apparatus as recited in the claims.

It should be understood that the steps of the illustrative methods set forth herein are not necessarily required to be performed in the order described, and the order of the steps of such methods should be understood to be merely examples. Likewise, additional steps might be included in such methods, and certain steps might be omitted or combined, in methods consistent with various embodiments.

It will be further understood that various changes in the details, materials, and arrangements of the parts that have been described and illustrated herein might be made by those skilled in the art without departing from the scope of the following claims.

We claim:

1. A magnetic field sensor, comprising:
a back bias magnet configured to generate a DC magnetic field;
first and second magnetic field sensing elements disposed along a sensing element line and disposed proximate to at least one ferromagnetic surface of a ferromagnetic target object, the first and second magnetic field sensing elements configured to generate first and second electronic signals, respectively, in response to first and second sensed magnetic fields corresponding to the DC magnetic field but influenced by the at least one ferromagnetic surface;
wherein the magnetic field sensor is operable to generate a difference signal that is a difference of amplitudes of the first and second electronic signals, and the difference signal is indicative of a rotation measurement of an absolute relative rotation of the ferromagnetic target object and the magnetic field sensor about a rotation axis, wherein the sensing element line is substantially parallel to the rotation axis, wherein the at least one ferromagnetic surface of the ferromagnetic target object comprises a helical groove disposed on the ferromagnetic target object, the helical groove configured to provide the difference signal with respect to the absolute relative rotation.

2. The magnetic field sensor of claim 1, wherein the difference signal is substantially linear with respect to the absolute relative rotation of the ferromagnetic target object and the magnetic field sensor about the rotation axis.

3. The magnetic field sensor of claim 1, wherein the at least one ferromagnetic surface comprises a first groove surface and a second groove surface, the first and second groove surfaces intersecting at a vertex, thereby forming a V-shaped helical groove.

4. The magnetic field sensor of claim 3, wherein the first groove surface and the second groove surface are straight in one dimension.

5. The magnetic field sensor of claim 3, wherein the first groove surface and the second groove surface are curved in two dimensions.

6. The magnetic field sensor of claim 5, wherein curvatures of the first and second groove surfaces are selected to provide the difference signal as substantially linear with respect to the absolute relative rotation of the ferromagnetic target object and the magnetic field sensor about the rotation axis.

7. The magnetic field sensor of claim 1, wherein the absolute relative rotation of the ferromagnetic target object and the magnetic field sensor about the rotation axis comprises a rotation of the ferromagnetic target object about the rotation axis and the magnetic field sensor is stationary.

8. The magnetic field sensor of claim 1, further comprising:
a differential amplifier coupled to receive the first and second electronic signals and configured to generate the difference signal.

9. The magnetic field sensor of claim 1, wherein the ferromagnetic target object comprises a rotating shaft, and the first and second magnetic field sensing elements are disposed in a side-shaft measurement arrangement with respect to the rotating shaft.

10. The magnetic field sensor of claim 1, wherein the helical groove comprises a helix structure having a first helix portion corresponding to an absolute relative rotation of the ferromagnetic target object and the magnetic field sensor between zero degrees and a maximum rotation angle that is less than three hundred sixty degrees, and a second portion proximate to the helical groove that is flat.

11. The magnetic field sensor of claim 1, wherein the helical groove comprises a symmetrical helix structure having a first helix portion and a second helix portion, the first helix portion corresponding to an absolute relative rotation of the ferromagnetic target object and the magnetic field sensor between zero degrees and one hundred eighty degrees, and the second helix portion corresponding to an absolute relative rotation of the ferromagnetic target object and the magnetic field sensor between one hundred eighty degrees and three hundred sixty degrees, wherein the first and second helix portions are symmetrical with each other.

12. The magnetic field sensor of claim 11, wherein the magnetic field sensor is configured to detect a one hundred eighty degree symmetry of the helix structure in regard to the absolute relative rotation of the ferromagnetic target object and the magnetic field sensor, thereby determining an absolute relative rotation angle over a rotation greater than three hundred sixty degrees.

13. The magnetic field sensor of claim 12, wherein the absolute relative rotation angle, $\theta_{abs}$, of the ferromagnetic target object is determined by a relationship $\theta_{abs}=\theta(\Delta B)$ in the first helix portion and by the relationship $\theta_{abs}=360°-\theta(\Delta B)$ in the second helix portion, wherein $\theta(\Delta B)$ is a differential of a magnetic field related to the difference signal, wherein an amplitude of the difference signal is related to the absolute relative rotation of the ferromagnetic target object and the magnetic field sensor about the rotation axis.

14. A method of sensing an absolute relative rotation of a ferromagnetic target object and a magnetic field sensor about a rotation axis, the method comprising:
generating a DC magnetic field by a back bias magnet;
generating first and second electronic signals, respectively, by first and second magnetic field sensing elements disposed along a sensing element line and disposed proximate to at least one ferromagnetic surface of a ferromagnetic target object, the first and second electronic signals in response to first and second sensed magnetic fields corresponding to the DC magnetic field but influenced by the at least one ferromagnetic surface;

generating, by the magnetic field sensor, a difference signal that is a difference of amplitudes of the first and second electronic signals, and the difference signal is indicative of a rotation measurement of an absolute relative rotation of the ferromagnetic target object and the magnetic field sensor about a rotation axis, wherein the sensing element line is substantially parallel to the rotation axis, axis, wherein the at least one ferromagnetic surface of the ferromagnetic target object comprises a helical groove disposed on the ferromagnetic target object, the helical groove configured to provide the difference signal with respect to the absolute relative rotation.

15. The method of claim 14, wherein the difference signal is substantially linear with respect to the absolute relative rotation of the ferromagnetic target object and the magnetic field sensor about the rotation axis.

16. The method of claim 14, wherein the at least one ferromagnetic surface comprises a first groove surface and a second groove surface, the first and second groove surfaces intersecting at a vertex, thereby forming a V-shaped helical groove.

17. The method of claim 16, wherein the first groove surface and the second groove surface are straight in one dimension.

18. The method of claim 16, wherein the first groove surface and the second groove surface are curved in two dimensions.

19. The method of claim 18, comprising:
providing the difference signal as substantially linear with respect to the absolute relative rotation of the ferromagnetic target object and the magnetic field sensor about the rotation axis based upon curvatures of the first and second groove surfaces.

20. The method of claim 14, wherein the absolute relative rotation of the ferromagnetic target object and the magnetic field sensor about the rotation axis comprises a rotation of the ferromagnetic target object about the rotation axis and the magnetic field sensor is stationary.

21. The method of claim 14, further comprising:
receiving, by a differential amplifier, the first and second electronic signals and generating the difference signal.

22. The method of claim 14, wherein the ferromagnetic target object comprises a rotating shaft, and the first and second magnetic field sensing elements are disposed in a side-shaft measurement arrangement with respect to the rotating shaft.

23. The method of claim 14, wherein the helical groove comprises a ix structure having a first helix portion corresponding to an absolute relative rotation of the ferromagnetic target object and the magnetic field sensor between zero degrees and a maximum rotation angle that is less than three hundred sixty degrees, and a second portion proximate to the helical groove that is flat.

24. The method of claim 14, wherein the helical groove comprises a symmetrical helix structure having a first helix portion and a second helix portion, the first helix portion corresponding to an absolute relative rotation of the ferromagnetic target object and the magnetic field sensor between zero degrees and one hundred eighty degrees, and the second helix portion corresponding to an absolute relative rotation of the ferromagnetic target object and the magnetic field sensor between one hundred eighty degrees and three hundred sixty degrees, wherein the first and second helix portions are symmetrical with each other.

25. The method of claim 24, comprising:
detecting, by the magnetic field sensor, a one hundred eighty degree symmetry of the helix structure in regard to the absolute relative rotation of the ferromagnetic target object and the magnetic field sensor; and
determining an absolute relative rotation angle over a rotation greater than three hundred sixty degrees.

26. The method of claim 25, comprising:
determining the absolute relative rotation angle, $\theta_{abs}$, of the ferromagnetic target object by a relationship $\theta_{abs}=\theta(\Delta B)$ in the first helix portion and by the relationship $\theta_{abs}=360°-\theta(\Delta B)$ in the second helix portion, wherein $\theta(\Delta B)$ is a differential of a magnetic field related to the difference signal, wherein an amplitude of the difference signal is related to the absolute relative rotation of the ferromagnetic target object and the magnetic field sensor about the rotation axis.

* * * * *

UNITED STATES PATENT AND TRADEMARK OFFICE
CERTIFICATE OF CORRECTION

PATENT NO. : 9,869,566 B2
APPLICATION NO. : 15/042469
DATED : January 16, 2018
INVENTOR(S) : Simon Tima et al.

Page 1 of 1

It is certified that error appears in the above-identified patent and that said Letters Patent is hereby corrected as shown below:

Column 5, Line 18, delete "that are few millimeters away" and replace with --that are a few millimeters away--.

Column 5, Lines 40 to 41, delete "can extends" and replace with --can extend--.

Column 6, Line 36, delete "N-bit" and replace with --$N$-bit--.

Column 8, Line 62, delete "where L is" and replace with --where $L$ is--.

Column 8, Line 63, delete "S is a" and replace with --$S$ is a--.

Column 8, Line 65, delete "P is" and replace with --$P$ is--.

Column 11, Line 1, delete "field AB" and replace with --field $\Delta B$--.

Column 13, Line 1, delete "1406f Magnetic" and replace with --1406f. Magnetic--.

Column 14, Line 11, delete ""interface,", "model"" and replace with --"interface," "model"--.

Signed and Sealed this
Eighth Day of January, 2019

Andrei Iancu
*Director of the United States Patent and Trademark Office*